United States Patent
Lim et al.

(10) Patent No.: US 12,038,656 B2
(45) Date of Patent: Jul. 16, 2024

(54) DISPLAY DEVICE

(71) Applicant: Samsung Display Co., Ltd., Yongin-si (KR)

(72) Inventors: Hyung Chul Lim, Cheonan-si (KR); Yang Hee Kim, Yongin-si (KR); So Yeon Park, Seoul (KR); Sang Hun Oh, Cheonan-si (KR); Sung Woo Jung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 410 days.

(21) Appl. No.: 17/355,190

(22) Filed: Jun. 23, 2021

(65) Prior Publication Data

US 2021/0408211 A1  Dec. 30, 2021

(30) Foreign Application Priority Data

Jun. 25, 2020  (KR) .................. 10-2020-0078068

(51) Int. Cl.
*G02F 1/1345* (2006.01)
*G09G 3/3225* (2016.01)
*H10K 59/131* (2023.01)

(52) U.S. Cl.
CPC ........ *G02F 1/1345* (2013.01); *G02F 1/13452* (2013.01); *G02F 1/13454* (2013.01); *G09G 3/3225* (2013.01); *H10K 59/131* (2023.02)

(58) Field of Classification Search
None
See application file for complete search history.

(56) References Cited

U.S. PATENT DOCUMENTS 7,936,120 B2   5/2011 Kim et al.
2012/0140424 A1* 6/2012 Sato .................. G02F 1/13452
                                                 257/E29.273

FOREIGN PATENT DOCUMENTS

KR   10-2019-0051513   5/2019

* cited by examiner

*Primary Examiner* — Dung T Nguyen
(74) *Attorney, Agent, or Firm* — KILE PARK REED & HOUTTEMAN PLLC

(57) ABSTRACT

A display device including a display area configured to display an image, a first non-display area disposed adjacent to the display area, a second non-display area disposed adjacent to the first non-display area, and a first driving voltage line disposed in the first non-display area and the second non-display area, the first driving voltage line being configured to be applied with a first driving voltage and includes a first sub-driving voltage line including first holes, and a second sub-driving voltage line disposed on the first sub-driving voltage line and including second holes, in which the second holes include first sub-holes and second sub-holes having a different size than the first sub-holes.

20 Claims, 20 Drawing Sheets

DISPLAY DEVICE

CROSS-REFERENCE TO RELATED APPLICATION

This application claims priority from and the benefit of Korean Patent Application No. 10-2020-0078068, filed on Jun. 25, 2020, which is hereby incorporated by reference for all purposes as if fully set forth herein

BACKGROUND

Field

Exemplary embodiments of the invention relate generally to a display device and, more particular, to a display device having high reliability.

Discussion of the Background

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device, such as a liquid crystal display device, a field emission display device and a light emitting display device. The light emitting display device include an organic light emitting display device including organic light emitting elements, an inorganic light emitting display device including inorganic light emitting elements such as inorganic semiconductors, and a micro light emitting display device including micro light emitting elements.

The organic light emitting display device may be manufactured by forming thin film transistors on a substrate, forming a planarization layer on the thin film transistors, and forming light emitting elements each having an anode electrode, a light emitting layer, and a cathode electrode on the planarization layer. In order to protect the light emitting layer and the cathode electrode against oxygen and moisture, an encapsulation layer including multiple organic and inorganic layers may further be formed on the light emitting elements.

The planarization layer may be formed of an organic layer, such as photo acryl and polyimide. Due to the nature of the planarization layer that absorbs moisture when being exposed to the atmosphere, in the process of depositing the planarization layer, it is necessary to remove moisture inside the vacuum deposition equipment before placing a substrate having thin film transistors formed thereon into the vacuum deposition equipment. However, some moisture may still remain on the planarization layer. In this case, an outgas generated from the planarization layer may damage the light emitting layer of the light emitting element, which may cause sub-pixel including the damaged light emitting layer appear as a black dot.

The above information disclosed in this Background section is only for understanding of the background of the inventive concepts, and, therefore, it may contain information that does not constitute prior art.

SUMMARY

Display devices constructed according to exemplary embodiments of the invention are capable of reducing or preventing damage to a light emitting layer of a light emitting element from an outgas generated from an organic layer.

Additional features of the inventive concepts will be set forth in the description which follows, and in part will be apparent from the description, or may be learned by practice of the inventive concepts.

A display device according to an exemplary embodiment includes a display area configured to display an image, a first non-display area disposed adjacent to the display area, a second non-display area disposed adjacent to the first non-display area, and a first driving voltage line disposed in the first non-display area and the second non-display area, the first driving voltage line being configured to be applied with a first driving voltage and includes a first sub-driving voltage line including first holes, and a second sub-driving voltage line disposed on the first sub-driving voltage line and including second holes, in which the second holes include first sub-holes and second sub-holes having a different size than the first sub-holes.

The first sub-holes may be disposed in the first non-display area and the second non-display area, and the second sub-holes may be disposed in the first non-display area.

A length of the second sub-hole in a first direction may be greater than a length of the first sub-hole in the first direction.

The first holes, the first sub-holes, and the second sub-holes may not overlap each other.

The second sub-driving voltage line may be connected to the first sub-driving voltage line through first connection holes in the first non-display area and the second non-display area, and the first connection holes may not overlap the first holes and the second holes.

In the first non-display area, one of the first connection holes may be disposed between one of the first holes and the first sub-hole in a first direction.

In the first non-display area, one of the first connection holes and the first hole may be disposed between adjacent second sub-holes in a second direction crossing the first direction.

In the second non-display area, the first holes and the first sub-holes may be alternately arranged in a first direction.

In the second non-display area, the first holes and the first sub-holes may be alternately arranged in a second direction crossing the first direction.

In the second non-display area, one of the first connection holes may be disposed between the first hole and the first sub-hole in the first direction.

The display device may further include a pixel electrode and a light emitting layer disposed in the display area, and a common electrode disposed on the light emitting layer, and connected to the second sub-driving voltage line through second connection holes in the second non-display area.

One of the second connection holes may overlap one of the first holes.

A display device according to another exemplary embodiment includes a display area configured to display an image, a first non-display area disposed adjacent to the display area, a second non-display area disposed adjacent to the first non-display area, and a first sub-driving voltage line disposed in the first non-display area and the second non-display area, the first sub-driving voltage line being configured to applied with a first driving voltage and includes first holes, in which the first holes include first sub-holes and second sub-holes having a different size than the first sub-holes.

The first sub-holes may be disposed in the first non-display area and the second non-display area, and the second sub-holes may be disposed in the first non-display area.

A length of the second sub-hole in a first direction may be greater than a length of the first sub-hole in the first direction.

The display device may further include a second sub-driving voltage line disposed on the first sub-driving voltage line and including second holes, in which the second holes, the first sub-holes, and the second sub-holes may not overlap each other.

The second sub-driving voltage line may be connected to the first sub-driving voltage line through first connection holes in the first non-display area and the second non-display area, and the first connection holes may not overlap the first holes and the second holes.

A display device according to still another exemplary embodiment includes a display area configured to display an image, a first non-display area disposed adjacent to the display area, a second non-display area disposed adjacent to the first non-display area, and a first driving voltage line disposed in the first non-display area and the second non-display area, the first driving voltage line being configured to be applied with a first driving voltage and includes a first sub-driving voltage line including first holes, and a second sub-driving voltage line disposed on the first sub-driving voltage line and including second holes, in which a size of one of the second holes in the first non-display area is different from a size of one of the second holes in the second non-display area.

In the first non-display area, a size of one of the first holes may be different from a size of the second hole.

A length of the second hole in a first direction in the first non-display area may be greater than a length of the second hole in the first direction in the second non-display area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
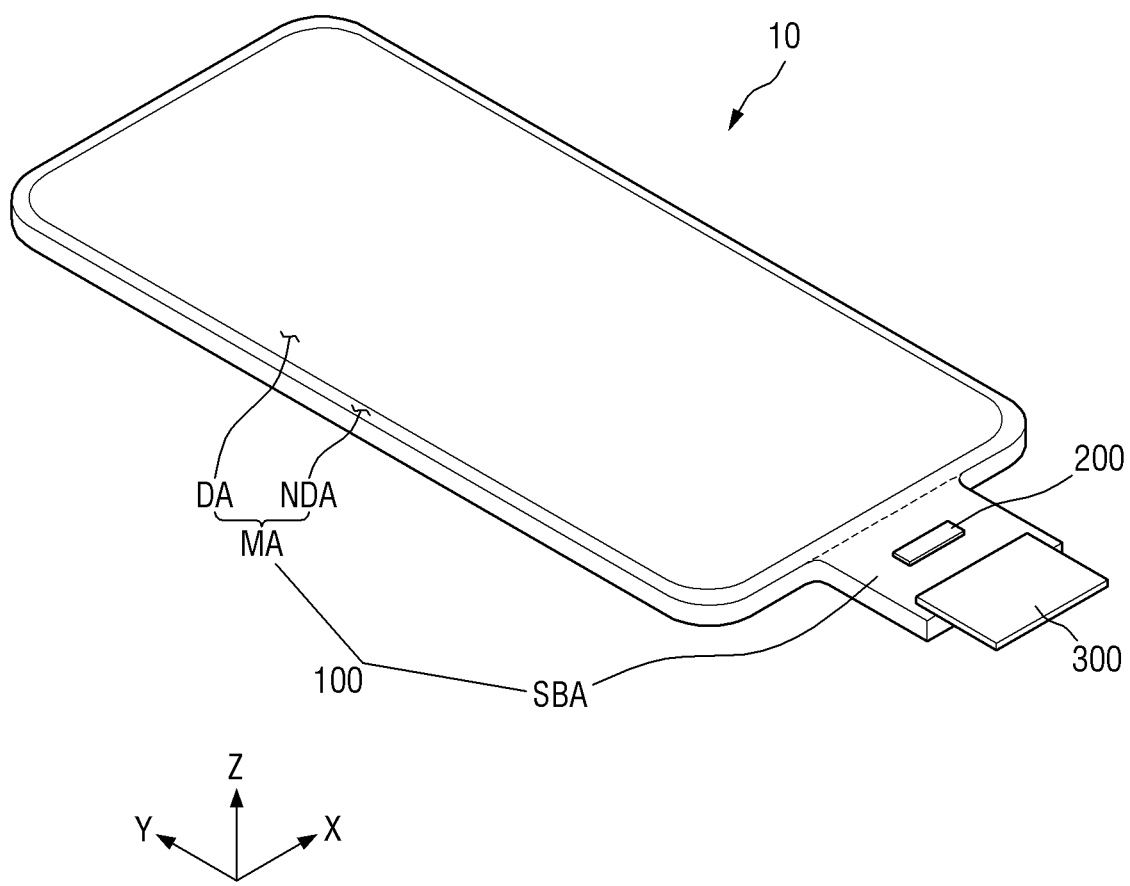
FIG. 1 is a perspective view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating a display device according to an exemplary embodiment.

Referring to FIG. 1, a display device 10 is a device for displaying a moving image or a still image. The display device 10 may be used as a display screen of various devices, such as a television, a laptop computer, a monitor, a billboard, and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device, and an ultra-mobile PC (UMPC).

The display device 10 may be a light emitting display device, such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). Hereinafter, the display device 10 will exemplarily be described as an organic light emitting display device, but the inventive concepts are not limited thereto.

The display device 10 includes a display panel 100, a display driving circuit 200, and a circuit board 300.

The display panel 100 may be formed in substantially a rectangular shape, in plan view, having short sides in a first direction (X-axis direction) and long sides in a second direction (Y-axis direction) crossing the first direction (X-axis direction). The corner where the short side in the first direction (X-axis direction) and the long side in the second direction (Y-axis direction) meet may be rounded to have a predetermined curvature or may be right-angled. The planar shape of the display panel 100 is not limited to a rectangular shape, and may be formed in other polygonal shapes, a circular shape or elliptical shape. The display panel 100 may be formed to be flat, but is not limited thereto. For example, the display panel 100 may include a curved portion formed at left and/or right ends, and having a predetermined curvature or a varying curvature. In addition, the display panel 100 may be flexible, so as to be bent, folded, or rolled.

The display panel 100 may include a main region MA and a sub-region SBA.

The main region MA may include a display area DA displaying an image and a non-display area NDA that is a peripheral area of the display area DA. The display area DA may include sub-pixels displaying an image. The sub-region SBA may protrude in the second direction (Y-axis direction) from one side of the main region MA.

Although it is exemplarily shown in FIG. 1 that the sub-region SBA is unfolded, the sub-region SBA may be bent so as to be placed on the bottom surface of the display panel 100. When the sub-region SBA is bent, the sub-region SBA may overlap the main region MA in the thickness direction (Z-axis direction) of the substrate SUB. The sub-region SBA may include the display driving circuit 200 formed thereon.

The display driving circuit 200 may generate signals and voltages for driving the display panel 100. The display driving circuit 200 may be formed as an integrated circuit (IC) and attached onto the display panel 100 by a chip on glass (COG) method, a chip on plastic (COP) method, or an ultrasonic bonding method, but the inventive concepts are not limited thereto. For example, in some exemplary embodiments, the display driving circuit 200 may be attached onto the circuit board 300 by a chip on film (COF) method.

The circuit board 300 may be attached to one end of the sub-region SBA of the display panel 100. Thus, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible film, such as a flexible printed circuit board, a printed circuit board, or a chip on film.

Figure 2:
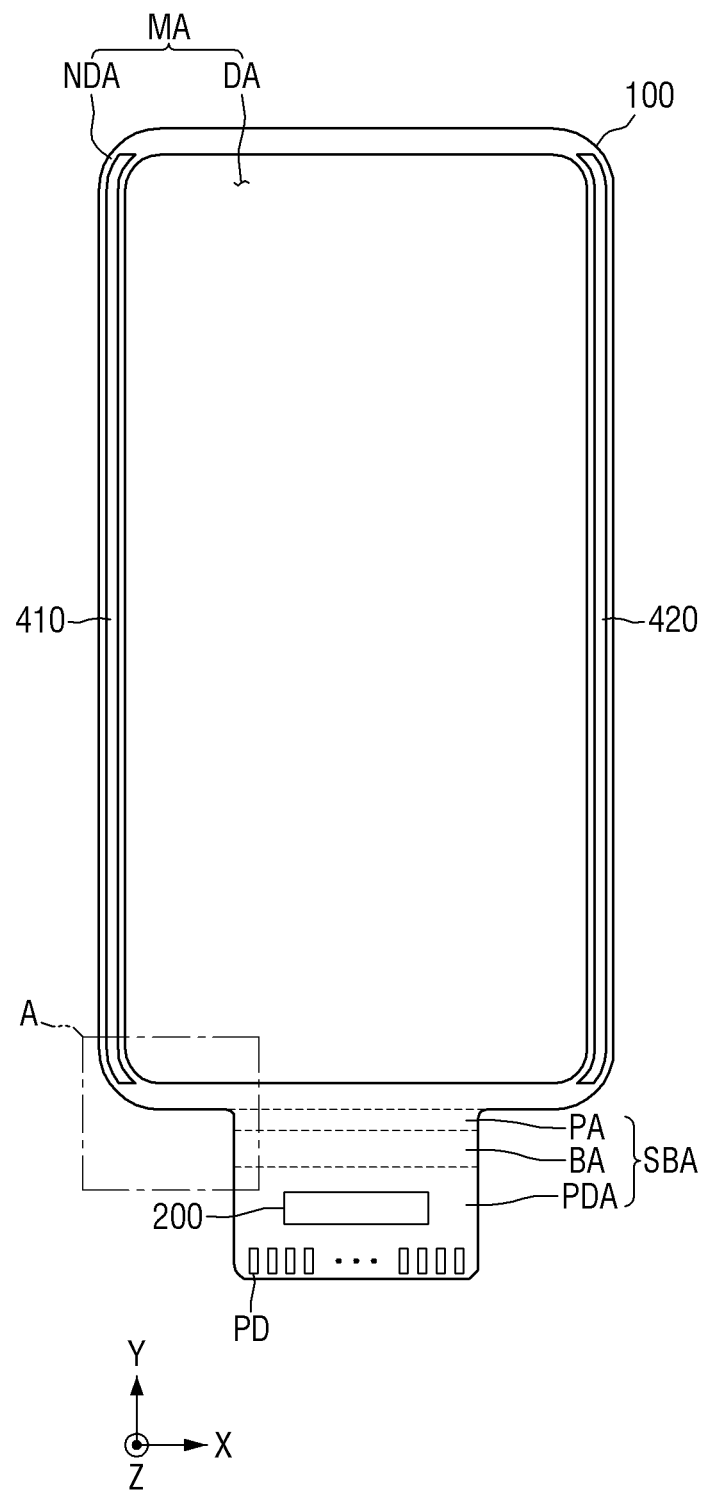
FIGS. 2 and 3 are plan views illustrating a display device according to an exemplary embodiment.
Figure 3:
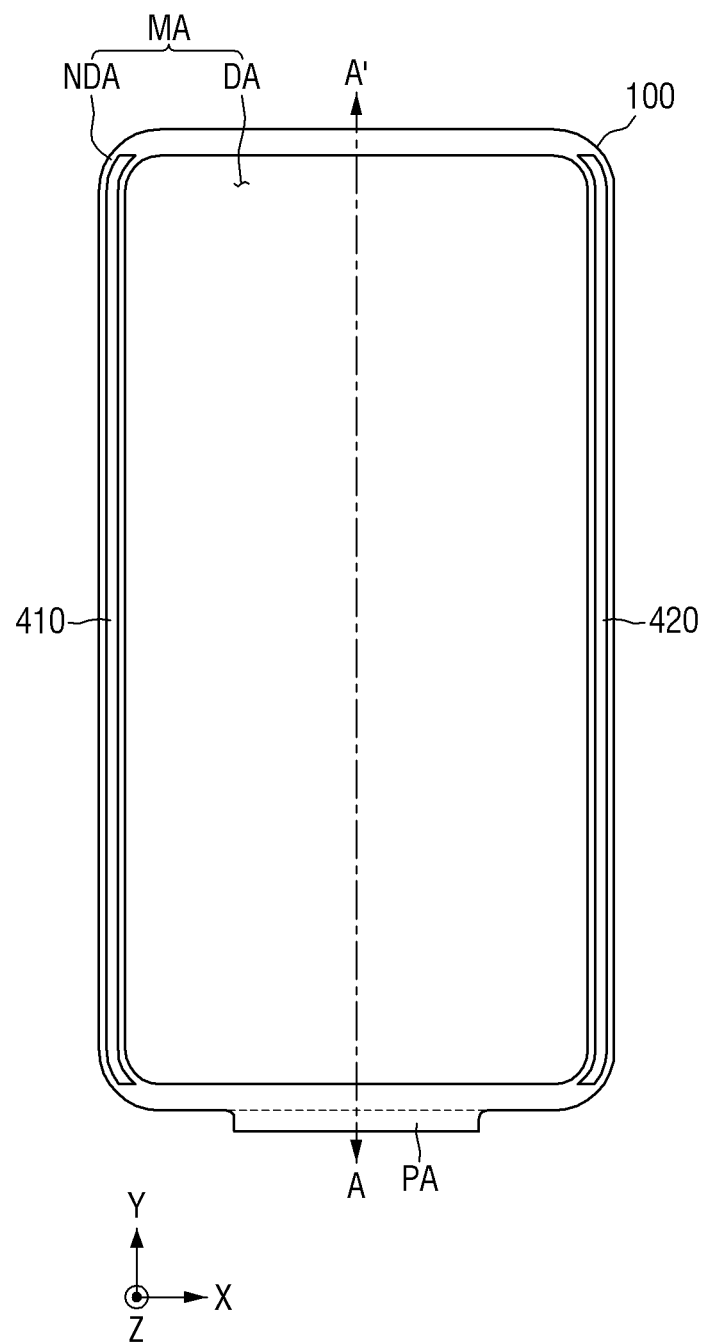
Figure 4:
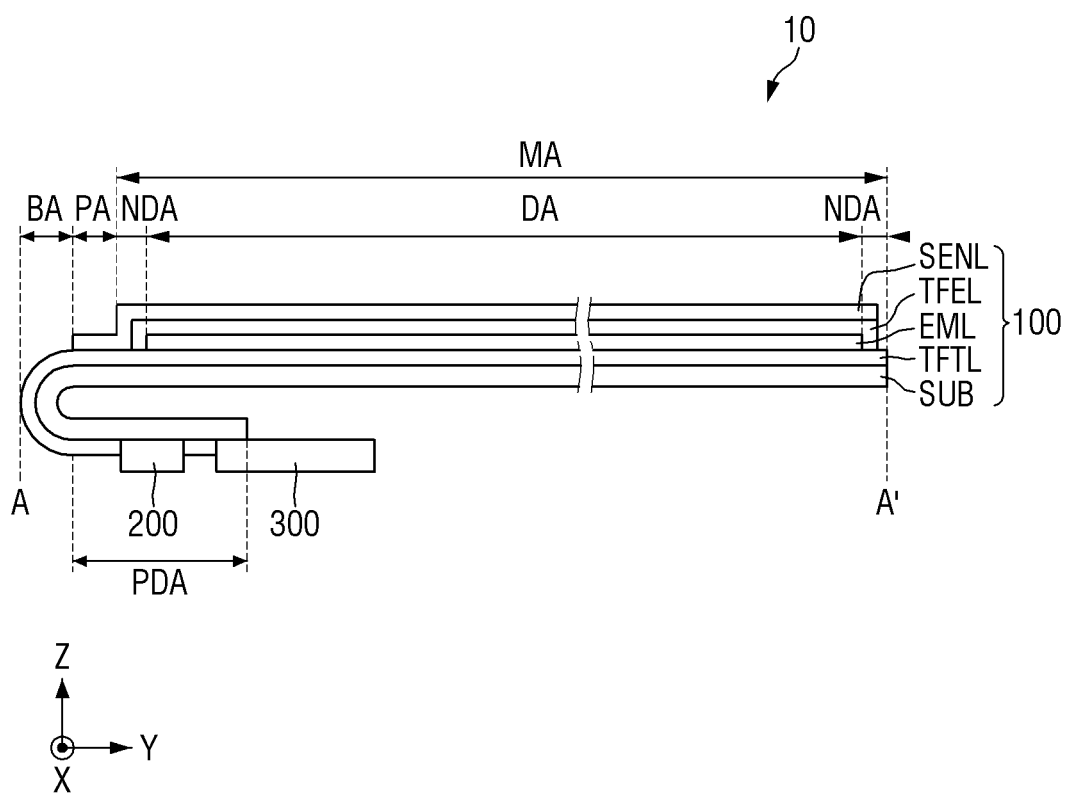
FIG. 4 is a side view illustrating a display device according to an exemplary embodiment.

FIGS. 2 and 3 are plan views illustrating a display device according to an embodiment. FIG. 4 is a side view illustrating a display device according to an exemplary embodiment.

FIG. 2 exemplarily shows that the sub-region SBA is unfolded without being bent, and FIG. 3 exemplarily shows that the sub-region SBA is bent.

Referring to FIGS. 2 and 3, the display panel 100 may include a main region MA and a sub-region SBA.

The main region MA may include a display area DA displaying an image and a non-display area NDA that is a peripheral area of the display area DA. The display area DA may occupy most of the main region MA. The display area DA may be disposed at the center of the main region MA.

The display area DA may include scan lines extending in the first direction (X-axis direction), data lines extending in the second direction (Y-axis direction), and sub-pixels connected to the scan lines and the data lines. Each of the sub-pixels may be connected to at least one scan line and at least one data line. When a scan signal is applied to at least one scan line, each of the sub-pixels may be supplied with a data voltage of a corresponding data line. Each of the sub-pixels may emit light with a predetermined luminance according to the data voltage.

The non-display area NDA may be disposed adjacent to the display area DA. The non-display area NDA may be an area outside the display area DA. The non-display area NDA may be disposed to surround the display area DA, without being limited thereto. The non-display area NDA may be an edge area of the display area DA.

The sub-region SBA may protrude in the second direction (Y-axis direction) from one side of the main region MA. The length of the sub-region SBA in the second direction (Y-axis direction) may be less than the length of the main region MA in the second direction (Y-axis direction). The length of the sub-region SBA in the first direction (X-axis direction) may be substantially equal to or less than the length of the main region MA in the first direction (X-axis direction). The sub-region SBA may be bent so as to be placed on the bottom surface of the display panel 100. In this case, the sub-region SBA may overlap the main region MA in the third direction (Z-axis direction).

The sub-region SBA may include a protrusion area PA, a pad area PDA, and a bending area BA.

The protrusion area PA is an area protruded from one side of the main region MA in the second direction (Y-axis direction). One side of the protrusion area PA may be connected to the non-display area NDA, and at the other side thereof may be connected to the bending area BA.

The pad area PDA is an area on which pads PD and the display driving circuit 200 are disposed. The display driving circuit 200 may be attached to driving pads of the pad area PDA using a low-resistance high-reliability material, such as self-assembly anisotropic conductive paste (SAP) or an anisotropic conductive film. The circuit board 300 may be attached to the pads PD of the pad area PDA using a low-resistance high-reliability material, such as SAP or an anisotropic conductive film. One side of the pad area PDA may be connected to the bending area BA.

The bending area BA is an area that may be bent. When bent, the bending area BA may be arranged below the protrusion area PA and the main region MA. The bending area BA may be arranged between the protrusion area PA and the pad area PDA. One end of the bending area BA may be connected to the protrusion area PA, and at the other end thereof may be connected to the pad area PDA.

Further, the display panel 100 may include a first scan driver 410 and a second scan driver 420. The first and second scan drivers 410 and 420 may be connected to the scan lines of the display area DA. The first and second scan drivers 410 and 420 may each receive a scan timing signal from the display driving circuit 200 through scan fan-out lines (SFL in FIG. 5). The first and second scan drivers 410 and 420 may each generate scan signals according to a scan timing signal and output the scan signals to the scan lines of the display area DA.

The first and second scan drivers 410 and 420 may be arranged in the non-display area NDA. The first scan driver 410 may be disposed outside the left side of the display area DA, and the second scan driver 420 may be disposed outside the right side of the display area DA.

Although it is shown in FIGS. 2 and 3 that the display panel 100 includes two scan drivers 410 and 420, however, the inventive concepts are not limited thereto. In some exemplary embodiments, the display panel 100 may include one scan driver and, in this case, one of the first and second scan drivers 410 and 420 may be omitted.

FIG. 4 is a side view illustrating a display device according to an exemplary embodiment.

More particularly, FIG. 4 is a cross-sectional view taken along line A-A' of the display device 10 of FIG. 3.

Referring to FIG. 4, the display panel 100 may include a substrate SUB, a thin film transistor layer TFTL, a light emitting element layer EML, a thin film encapsulation layer TFEL, and a sensor electrode layer SENL.

The thin film transistor layer TFTL may be disposed on the substrate SUB. The thin film transistor layer TFTL may be arranged in the main region MA and the sub-region SBA. The thin film transistor layer TFTL may include thin film transistors (ST1 in FIG. 10), scan lines, data lines, scan fan-out lines (SFL in FIG. 5), data fan-out lines (DFL in FIG. 5), a first driving voltage line VSL, the first scan driver 410, and the second scan driver 420.

The light emitting element layer EML may be disposed on the thin film transistor layer TFTL. The light emitting element layer EML may be arranged in the display area DA of the main region MA. The light emitting element layer EML may include light emitting elements arranged in emission areas.

The thin film encapsulation layer TFEL may be disposed on the light emitting element layer EML. The thin film encapsulation layer TFEL may be arranged in the display area DA and the non-display area NDA of the main region MA. The thin film encapsulation layer TFEL may include at least one inorganic layer and at least one organic layer for encapsulating the light emitting element layer EML.

The sensor electrode layer SENL may be disposed on the thin film encapsulation layer TFEL. The sensor electrode layer SENL may be arranged in the main region MA and the protrusion area PA of the sub-region SBA. The sensor electrode layer SENL may be arranged in the bending area BA and the pad area PDA of the sub-region SBA. The sensor electrode layer SENL may detect a touch of a human body or an object via sensor electrodes.

A polarization film may be disposed on the sensor electrode layer SENL to prevent the external light reflected by the lines and electrodes of the display panel 100 from degrading a user's visual perception of the display panel 100. The polarization film may include a first base material, a linear polarization plate, a phase retardation film, such as a λ/4 (quarter-wave) plate and/or a λ/2 (half-wave) plate, and a second base material. For example, the first base material, the linear polarization plate, the λ/4 plate, λ/2 plate, and the second base material may be sequentially stacked on the sensor electrode layer SENL.

In order to protect an upper portion of the display panel 100, a cover window may be disposed on the polarization film. The cover window may be attached onto the polarization film with a transparent adhesive material, such as optically clear resin (OCR) or an optically clear adhesive (OCA) film. The cover window may be made of an inorganic material such as glass, or an organic material such as plastic or a polymer material.

Figure 5:
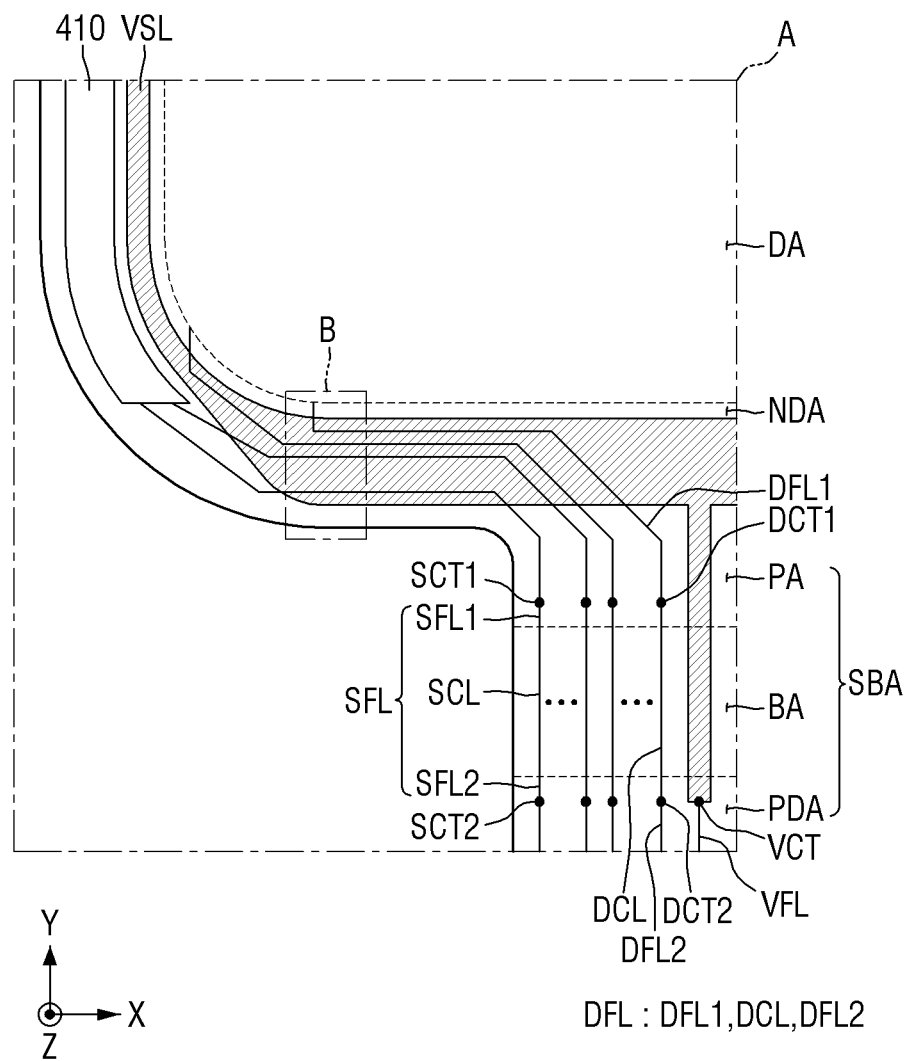
FIG. 5 is a layout view illustrating a scan driver, scan fan-out lines, data fan-out lines, and a first driving voltage line of a display panel according to an exemplary embodiment.

FIG. 5 is a layout view of a scan driver, scan fan-out lines, data fan-out lines, and a first driving voltage line of a display panel according to an exemplary embodiment. In particular, FIG. 5 is a layout view illustrating area A of FIG. 2 in detail according to an exemplary embodiment.

FIG. 5 exemplarily shows only the first scan driver 410, the scan fan-out lines SFL connecting the first scan driver 410 to the display driving circuit 200, the data fan-out lines DFL connecting the data lines of the display area DA to the display driving circuit 200, and the first driving voltage line VSL to simplify illustration.

The scan fan-out lines SFL may be connected to the first scan driver 410. The first scan driver 410 may be connected to the display driving circuit 200 via the scan fan-out lines SFL. The first scan driver 410 may receive a scan timing signal from the display driving circuit 200 via the scan fan-out lines SFL. The first scan driver 410 may generate scan signals according to the scan timing signal. The first scan driver 410 may output the scan signals to the scan lines of the display area DA.

The scan fan-out lines SFL, the data fan-out lines DFL, and the first driving voltage line VSL may be arranged in the non-display area NDA, and the protrusion area PA, bending area BA, and pad area PDA of the sub-region SBA.

The scan fan-out lines SFL may each include a first sub-scan fan-out line SFL1, a scan connection line SCL, and a second sub-scan fan-out line SFL2.

The first sub-scan fan-out line SFL1 may be arranged in the non-display area NDA and the protrusion area PA. The first sub-scan fan-out line SFL1 may be disposed between the first scan driver 410 and the scan connection line SCL. One end of the first sub-scan fan-out line SFL1 may be connected to the first scan driver 410, and at the other end thereof may be connected to the scan connection line SCL.

The scan connection line SCL may be arranged in the protrusion area PA, the bending area BA, and the pad area PDA. The scan connection line SCL may be disposed between the first sub-scan fan-out line SFL1 and the second sub-scan fan-out line SFL2. One end of the scan connection line SCL may be connected to the first sub-scan fan-out line SFL1 via a first scan connection hole SCT1 in the protrusion area PA, and the other end thereof may be connected to the second sub-scan fan-out line SFL2 via a second scan connection hole SCT2 in the pad area PDA.

The second scan fan-out line SFL2 may be arranged in the pad area PDA. The second scan fan-out line SFL2 may be disposed between the scan connection line SCL and the display driving circuit (200 in FIG. 2). One end of the second scan fan-out line SFL2 may be connected to the scan connection line SCL, and at the other end thereof may be connected to the display driving circuit (200 in FIG. 2).

The data fan-out lines DFL may each include a first sub-data fan-out line DFL1, a data connection line DCL, and a second sub-data fan-out line DRL2.

The first sub-data fan-out line DFL1 may be arranged in the non-display area NDA and the protrusion area PA. The first sub-data fan-out line DFL1 may be disposed between the data line DL and the data connection line DCL. One end of the first sub-data fan-out line DFL1 may be connected to the data line DL via a data contact hole DNT, and the other end thereof may be connected to the data connection line DCL via a first data connection hole DCT1.

The data connection line DCL may be arranged in the protrusion area PA, the bending area BA, and the pad area PDA. The data connection line DCL may be disposed between the first sub-data fan-out line DFL1 and the second sub-data fan-out line DFL2. One end of the data connection line DCL may be connected to the first sub-data fan-out line DFL1 via the first data connection hole DCT1 in the protrusion area PA, and the other end thereof may be connected to the second sub-data fan-out line DFL2 via the second data connection hole DCT2 in the pad area PDA.

The second sub-data fan-out line DFL2 may be arranged in the pad area PDA. The second sub-data fan-out line DFL2 may be disposed between the data connection line DCL and the display driving circuit (200 in FIG. 2). One end of the second sub-data fan-out line DFL2 may be connected to the data connection line DCL, and at the other end thereof may be connected to the display driving circuit (200 in FIG. 2).

Hereinafter, the scan fan-out lines SFL and the data fan-out lines DFL may be collectively referred to as fan-out lines.

The first driving voltage line VSL may be arranged in the non-display area NDA, the protrusion area PA, and the bending area BA. The first driving voltage line VSL may be disposed between the display area DA and the first scan driver 410 in the non-display area NDA. The first driving voltage line VSL may overlap the scan fan-out lines SFL and the data fan-out lines DFL in the non-display area NDA. The width of the first driving voltage line VSL in the non-display area NDA on the lower and outer side of the display area DA may be greater than that in the non-display area NDA on the left and outer side of the display area DA. The first driving voltage line VSL may be connected to the voltage fan-out line VFL via the voltage connection hole VCT in the pad area PDA.

The voltage fan-out line VFL may be arranged in the pad area PDA. The voltage fan-out line VFL may be disposed between the first driving voltage line VSL and the display driving circuit (200 in FIG. 2). One end of the voltage fan-out line VFL may be connected to the first driving voltage line VSL, and at the other end thereof may be connected to the display driving circuit (200 in FIG. 2).

Figure 6:
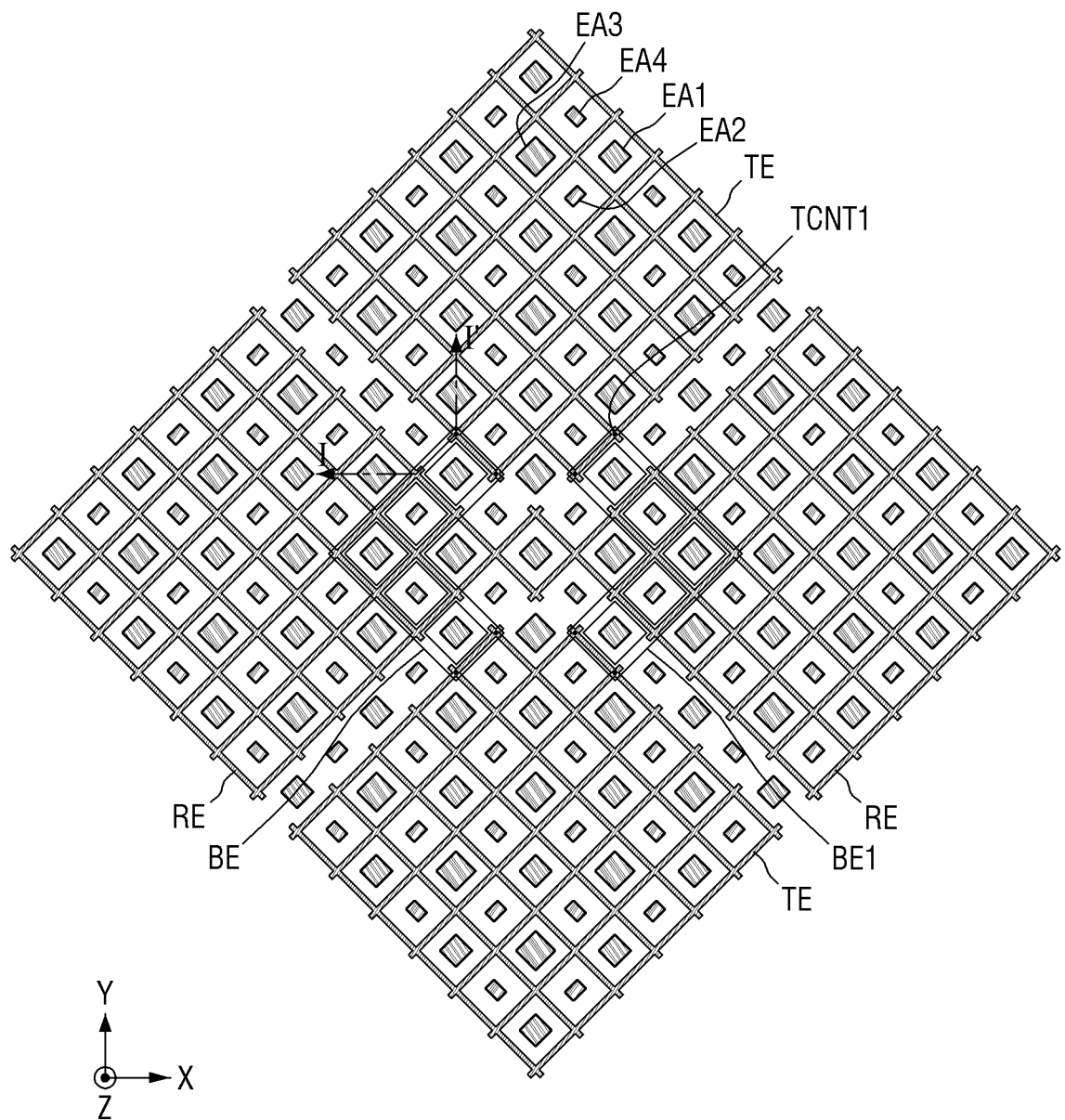
FIG. 6 is a layout view of a display area of FIG. 5 according to an exemplary embodiment.

FIG. 6 is a layout view of a display area of FIG. 5 according to an exemplary embodiment.

FIG. 6 shows first to fourth emission areas EA1, EA2, EA3, and EA4 of the light emitting element layer (EML in FIG. 4) and driving electrodes TE and sensing electrodes RE of the sensor electrode layer (SENL in FIG. 4) according to an exemplary embodiment. FIG. 6 exemplarily shows mutual capacitance type touch electrodes including two kinds of sensor electrodes, i.e., the driving electrodes TE and the sensing electrodes RE, for detecting a touch of the user. To simplify illustration, FIG. 6 illustrates only two sensing electrodes RE adjacent in the first direction (X-axis direction) and two driving electrodes TE adjacent in the second direction (Y-axis direction).

Referring to FIG. 6, the driving electrodes TE and the sensing electrodes RE may be electrically separated from each other. The driving electrodes TE and the sensing electrodes RE may be arranged to be separated from each other on the same layer. The driving electrodes TE and the sensing electrodes RE may have a gap therebetween.

The sensing electrodes RE may be electrically connected in the first direction (X-axis direction). The driving electrodes TE may be electrically connected in the second direction (Y-axis direction). For electrical separation between the sensing electrodes RE and the driving electrodes TE at the intersections thereof, the driving electrodes TE adjacent in the second direction (Y-axis direction) may be connected via connection electrodes BE1.

The connection electrodes BE1 may be formed on a layer different from the layer on which the driving and sensing electrodes TE and RE are formed, and may be connected to the driving electrodes TE via first sensor contact holes TCNT1. One end of the connection electrodes BE1 may be connected to one of the driving electrodes TE adjacent in the second direction (Y-axis direction) via the first sensor contact holes TCNT1. In addition, another end of the connection electrodes BE1 may be connected to another one of the driving electrodes TE adjacent in the second direction (Y-axis direction) via the first sensor contact holes TCNT1. The connection electrodes BE1 may overlap the sensing electrodes RE in the third direction (Z-axis direction). Since the connection electrodes BE1 may be formed on a layer different from the layer where the driving and sensing electrodes TE and RE are formed, the connection electrodes BE1 may be electrically separated from the sensing electrodes RE even when the connection electrodes BE1 overlap the sensing electrodes RE in the third direction (Z-axis direction).

The connection electrodes BE1 may be bent at least once. FIG. 6 exemplarily shows that the connection electrodes BE1 are bent to have substantially a staple shape ("<" or ">"), the inventive concepts are not limited to a particular shape of the connection electrodes BE1. Since the driving electrodes TE adjacent in the second direction (Y-axis direction) are connected via the plurality of connection electrodes BE1, even when one of the connection electrodes BE1 is broken, the driving electrodes TE adjacent in the second direction (Y-axis direction) may be electrically connected to each other.

Each of the driving electrodes TE and the sensing electrodes RE may have a shape of a mesh or a net in plan view. Since the driving electrodes TE and the sensing electrodes RE are formed on the thin film encapsulation layer (TFEL in FIG. 4), the distance between a common electrode (173 in FIG. 10) of the light emitting element (170 in FIG. 10) and the driving electrode TE or the sensing electrode RE may be small. This may cause a parasitic capacitance between the common electrode (173 in FIG. 10) of the light emitting element (170 in FIG. 10) and the driving electrode TE or the sensing electrode RE. As the parasitic capacitance is proportional to the size of an overlapping area between the common electrode (173 in FIG. 10) of the light emitting element (170 in FIG. 10) and the driving electrode TE or the sensing electrode RE, in order to reduce the parasitic capacitance, the driving and sensing electrodes TE and RE may have a shape of a mesh or a net in plan view.

The display area DA may include a plurality of sub-pixels for displaying an image. The plurality of sub-pixels may each include the light emitting elements (170 in FIG. 10) and the thin film transistors of the thin film transistor layer TFTL for emitting a certain light. Each of the emission areas EA1, EA2, EA3, and EA4 denotes an emission area of the light emitting element (170 in FIG. 10) for emitting a certain light.

For example, when the display area DA includes first to fourth sub-pixels, the first emission area EA1 may be an emission area of the light emitting element (170 in FIG. 10) of the first sub-pixel for emitting a first light, and the second emission area EA2 may be an emission area of the light emitting element (170 in FIG. 10) of the second sub-pixel for emitting a second light. Likewise, the third emission area EA3 may be an emission area of the light emitting element (170 in FIG. 10) of the third sub-pixel for emitting a third light, and the fourth emission area EA4 may be an emission area of the light emitting element (170 in FIG. 10) of the fourth sub-pixel for emitting a fourth light. The first to fourth sub-pixels may be defined as one pixel for expressing a white gradation.

The first emission area EA1, the second emission area EA2, the third emission area EA3, and the fourth emission area EA4 may emit different color lights. In some exemplary embodiments, at least two of the first emission area EA1, the second emission area EA2, the third emission area EA3, and the fourth emission area EA4 may emit the same color light. For example, the first emission area EA1 may emit a red light, the second and fourth emission areas EA2 and EA4 may emit a green light, and the third emission area EA3 may emit a blue light.

Although each of the first emission area EA1, the second emission area EA2, the third emission area EA3, and the fourth emission area EA4 is exemplarily shown as having substantially a quadrangular shape, such as a rhombus in plan view, the inventive concepts are not limited thereto. For example, in some exemplary embodiments, the first emission area EA1, the second emission area EA2, the third emission area EA3, and the fourth emission area EA4 may each have a shape of a polygonal, other than a quadrangle, a circle, or an ellipse in plan view. In addition, although it is exemplarily shown that the third emission area EA3 is the largest, the first emission area EA1 is the second largest, and the second and the fourth emission areas EA2 and EA4 are the smallest among the first emission area EA1, the second emission area EA2, the third emission area EA3, and the fourth emission area EA4, the inventive concepts are not limited thereto.

As the driving electrodes TE, the sensing electrodes RE, and the connection electrodes BE1 are arranged in a mesh structure or a net structure in plan view, the emission areas EA may not overlap the driving electrodes TE, the sensing electrodes RE, and the connection electrodes BE1 in the third direction (Z-axis direction). In this manner, a reduction in luminance of light emitted from each of the emission areas EA may be avoided or mitigated, which may otherwise be caused when the driving electrodes TE, the sensing electrodes RE, and the connection electrodes BE1 block light.

Figure 7:
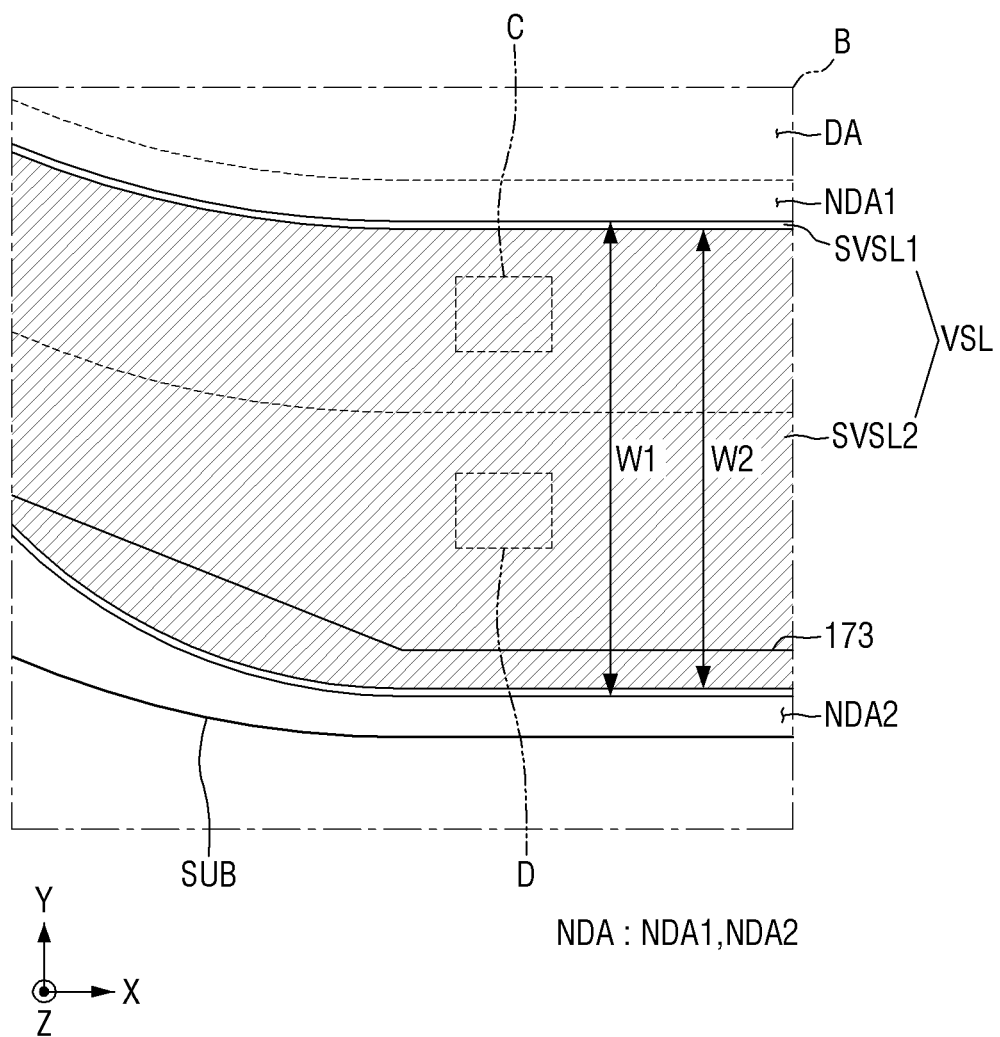
FIG. 7 is a layout view illustrating a display area, a first non-display area, a second non-display area, a first driving voltage line, and a common electrode according to an exemplary embodiment.

FIG. 7 is a layout view illustrating a display area, a first non-display area, a second non-display area, a first driving voltage line, and a common electrode according to an exemplary embodiment. In particular, FIG. 7 is a layout view showing area B of FIG. 5 in detail according to an exemplary embodiment.

Referring to FIG. 7, the non-display area NDA may include a first non-display area NDA1 arranged close to the display area DA and a second non-display area NDA2 arranged close to the first non-display area NDA1. The first non-display area NDA1 may be disposed between the display area DA and the second non-display area NDA2. The second non-display area NDA2 may be disposed at the edge of the display panel 100.

The first driving voltage line VSL may be arranged in the first and second non-display areas NDA1 and NDA2. The first driving voltage line VSL includes a first sub-driving voltage line SVSL1 and a second sub-driving voltage line SVSL2 overlapping each other in the third direction (Z-axis direction). The second sub-driving voltage line SVSL2 may be disposed on the first sub-driving voltage line SVSL1.

The second sub-driving voltage line SVSL2 may be connected to the first sub-driving voltage line SVSL1 via a plurality of first connection holes (CCT1 in FIGS. 8 and 9) in the first and second non-display areas NDA1 and NDA2. In this case, the first and second sub-driving voltage lines SVSL1 and SVSL2 may be applied with a first driving voltage.

Although it is exemplarily shown in FIG. 7 that the first sub-driving voltage line SVSL1 has a width W1 greater than a width W2 of the second sub-driving voltage line SVSL2, the inventive concepts are not limited thereto. In some exemplary embodiments, the first sub-driving voltage line SVSL1 may have a smaller width than the second sub-driving voltage line SVSL2, or the first sub-driving voltage line SVSL1 and the second sub-driving voltage line SVSL2 may have substantially the same width as each other.

The common electrode 173 may be arranged in the display area DA and the first and second non-display areas NDA1 and NDA2. The common electrode 173 may overlap the first and second sub-driving voltage lines SVSL1 and SVSL2 in the third direction (Z-axis direction). The common electrode 173 may be disposed on the second sub-driving voltage line SVSL2.

The common electrode 173 may connect a plurality of second connection holes (CCT2 in FIG. 9) to the second sub-driving voltage line SVSL2 in the second non-display area NDA2. In this manner, the common electrode 173 may be applied with the first driving voltage.

The end of the first sub-driving voltage line SVSL1 may be disposed closer to the edge of the substrate SUB than the end of the common electrode 173. In particular, the end of the second sub-driving voltage line SVSL2 may be disposed closer to the edge of the substrate SUB than the end of the common electrode 173.

Figure 8:
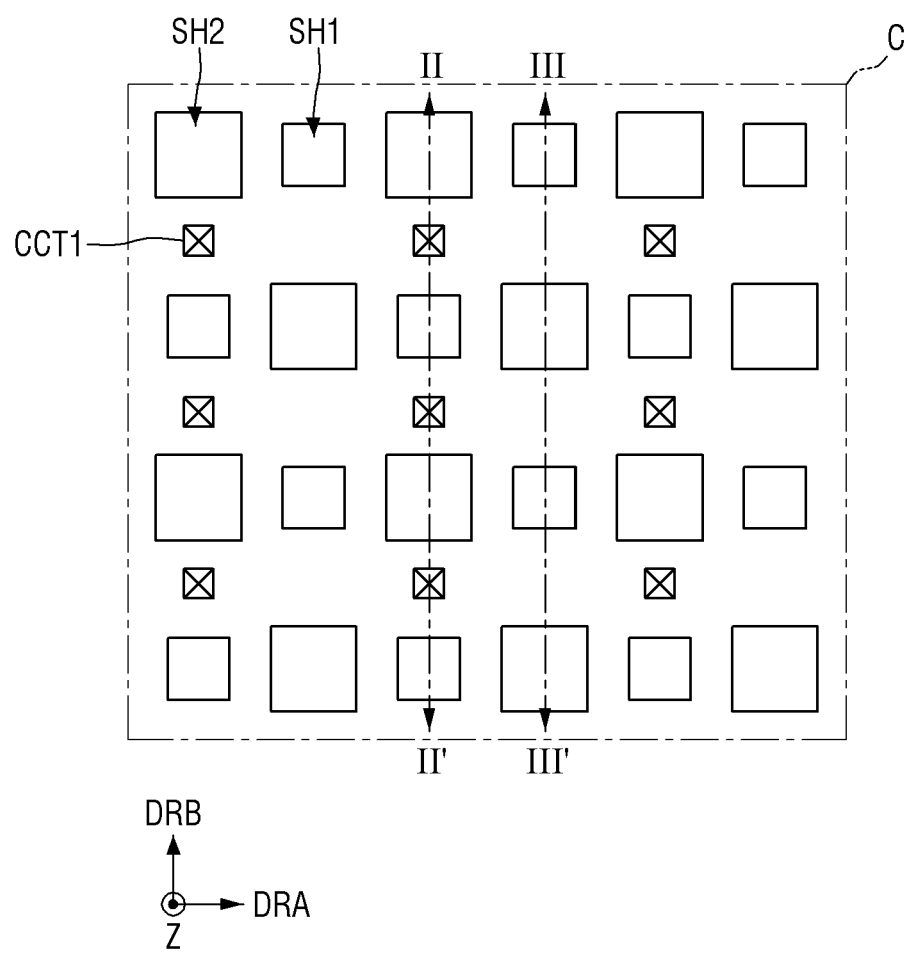
FIG. 8 is a layout view of the first non-display area of FIG. 6 according to an exemplary embodiment.
Figure 9:
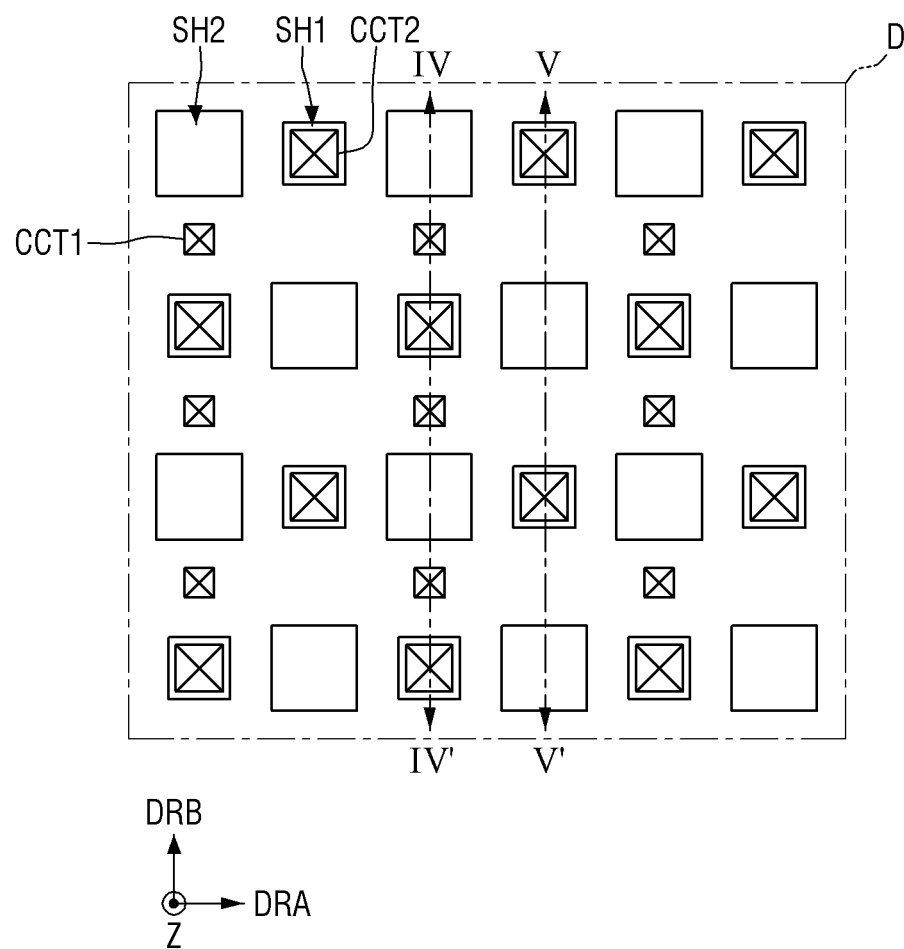
FIG. 9 is a layout view of the second non-display area of FIG. 6 according to an exemplary embodiment.

FIG. 8 is a layout view of the first non-display area of FIG. 6 in detail according to an exemplary embodiment. FIG. 9 is a layout view illustrating the second non-display area of FIG. 6 in detail according to an exemplary embodiment.

FIG. 8 is a layout view of area C of FIG. 7 in detail, and FIG. 9 is a layout view of D of FIG. 7 in detail.

Referring to FIGS. 8 and 9, the first sub-driving voltage line SVSL1 may include first holes SH1 arranged in the first and second non-display areas NDA1 and NDA2. The second sub-driving voltage line SVSL2 may include second holes SH2 arranged in the first and second non-display areas NDA1 and NDA2. The first and second holes SH1 and SH2 may form an outgas passage of an organic layer. The outgas passage formed by the first and second holes SH1 and SH2 will be described in more detail later with reference to FIGS. 11 and 12.

The first and second holes SH1 and SH2 may be arranged alternately in one direction DRA. For example, the first and second holes SH1 and SH2 may be arranged in the order of the first hole SH1, the second hole SH2, the first hole SH1, and the second hole SH2 in the one direction DRA.

The first and second holes SH1 and SH2 may be arranged alternately in the other direction DRB. For example, the first and second holes SH1 and SH2 may be arranged in the order of the first hole SH1, the second hole SH2, the first hole SH1, and the second hole SH2 in the other direction DRB.

The second sub-driving voltage line SVSL2 may be connected to the first sub-driving voltage line SVSL1 via the first connection holes CCT1 arranged in the first and second non-display areas NDA1 and NDA2. The first and second holes SH1 and SH2 and the first connection holes CCT1 may not overlap one another in the third direction (Z-axis direction). The first connection hole CCT1 may be arranged between the first and second holes SH1 and SH2 in the other direction DRB in odd-numbered columns, and may not be arranged between the first and second holes SH1 and SH2 in the other direction DRB in even-numbered columns.

The common electrode 173 may be connected to the second sub-driving voltage line SVSL2 via the second connection holes CCT2 arranged in the second non-display area NDA2. The second connection holes CCT2 may overlap the first holes SH1 in the third direction (Z-axis direction).

Although it is exemplarily shown in FIGS. 8 and 9 that the second connection holes CCT2 are smaller in size than the first holes SH1, the inventive concepts are not limited thereto. In some exemplary embodiments, the second connection holes CCT2 may be larger in size than the first holes SH1, or the second connection holes CCT2 may be substantially equal in size to the first holes SH1.

Although it is exemplarily shown in FIGS. 8 and 9 that each of the first holes SH1 is smaller in size than each of the second holes SH2, the inventive concepts are not limited thereto. In some exemplary embodiments, each of the first holes SH1 may be larger in size than each of the second holes SH2, or each of the first holes SH1 may be substantially equal in size to each of the second holes SH2.

Figure 10:
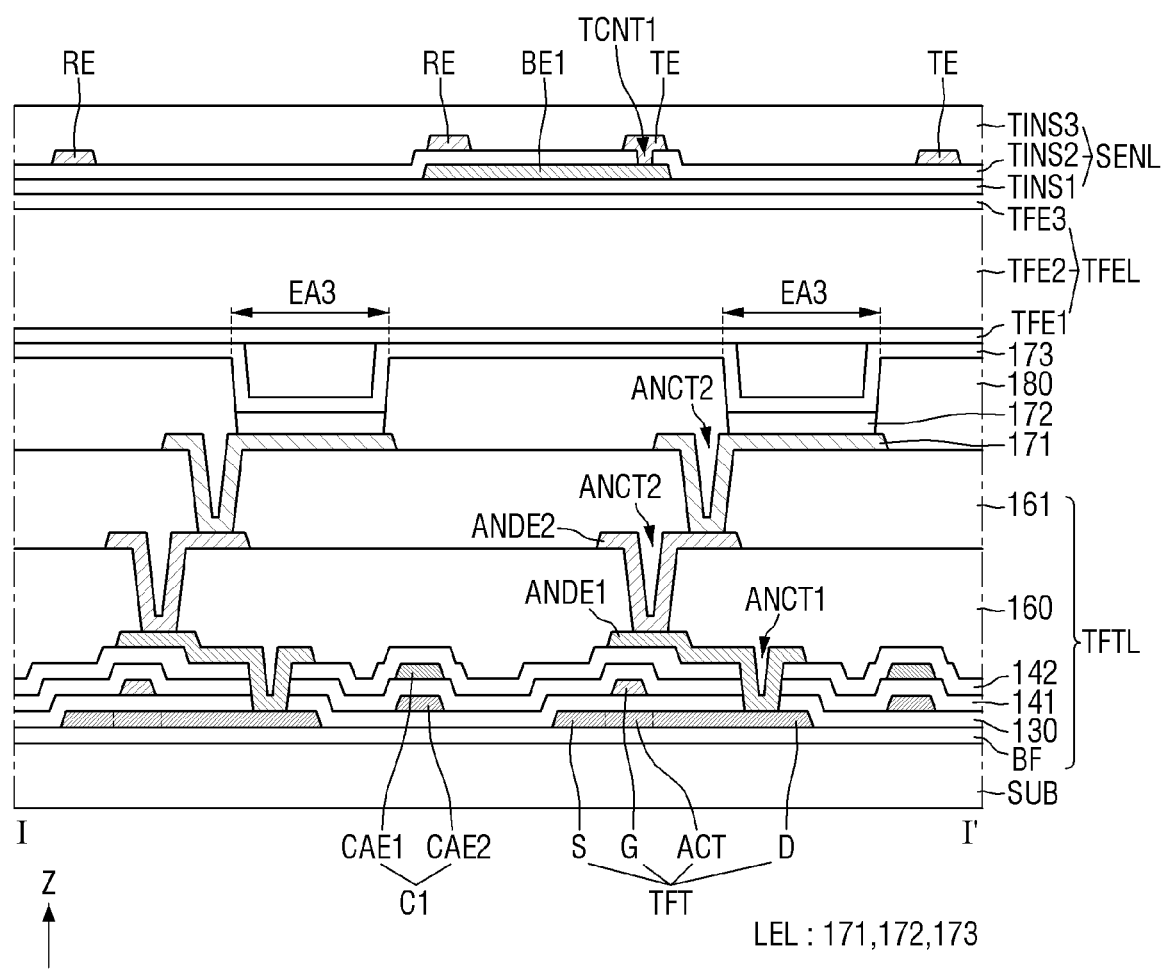
FIG. 10 is a cross-sectional view taken along line I-I' of the display panel of FIG. 6 according to an exemplary embodiment.

FIG. 10 is a cross-sectional view taken along line I-I' of a display panel of FIG. 6 according to an exemplary embodiment.

Referring to FIG. 10, the substrate SUB may be made of an insulating material, such as polymer resin or glass. For example, the substrate SUB may include polyimide. In this case, the substrate SUB may be a flexible substrate which can be bent, folded, or rolled.

A thin film transistor layer TFTL including thin film transistors TFT may be disposed on the substrate SUB. The thin film transistor layer TFTL may include thin film transistors TFT, a first anode connection electrode ANDE1, a second anode connection electrode ANDE2, a buffer layer BF, a gate insulating layer 130, a first interlayer insulating layer 141, a second interlayer insulating layer 142, a first organic layer 160, and a second organic layer 161.

The buffer layer BF may be disposed on the substrate SUB. The buffer layer BF may be formed of a silicon nitride layer, a silicon oxynitride layer, a silicon oxide layer, a titanium oxide layer, or an aluminum oxide layer.

The thin film transistors TFT may be disposed on the buffer layer BF. The thin film transistor TFT may include an active layer ACT, a gate electrode G, a source electrode S, and a drain electrode D.

The active layer ACT, the source electrode S, and the drain electrode D of the thin film transistor TFT may be disposed on the buffer layer BF. The active layer ACT may include a silicon semiconductor, such as polycrystalline silicon, monocrystalline silicon, low-temperature polycrystalline silicon, and amorphous silicon. The source electrode S and the drain electrode D may be formed by doping a silicon semiconductor with ions or impurities to have conductivity. The active layer ACT may overlap the gate electrode G in the third direction (Z-axis direction) that is the thickness direction of the substrate SUB, and the source electrode S and the drain electrode D may not overlap the gate electrode G in the third direction (Z-axis direction).

The gate insulating layer 130 may be disposed on the active layer ACT, the source electrode S, and the drain electrode D that form the thin film transistor TFT. The gate insulating layer 130 may be formed of an inorganic layer, for example, a silicon nitride layer, a silicon oxynitride layer, a silicon oxide layer, a titanium oxide layer, or an aluminum oxide layer.

The gate electrode G of the thin film transistor TFT and a first capacitor electrode CAE1 may be disposed on the gate insulating layer 130. The gate electrode G may overlap the active layer ACT in the third direction (Z-axis direction). The first capacitor electrode CAE1 may overlap a second capacitor electrode CAE2 in the third direction (Z-axis direction). The gate electrode G may be formed as a single layer or multiple layers, and may include at least one of molybdenum (Mo), aluminum (Al), chromium (Cr), gold (Au), titanium (Ti), nickel (Ni), neodymium (Nd), and copper (Cu), or an alloy thereof.

The first interlayer insulating layer 141 may be disposed on the gate electrode G and the first capacitor electrode CAE1. The first interlayer insulating layer 141 may be formed of an inorganic layer, for example, a silicon nitride layer, a silicon oxynitride layer, a silicon oxide layer, a titanium oxide layer, or an aluminum oxide layer.

The second capacitor electrode CAE2 may be disposed on the first interlayer insulating layer 141. The first interlayer insulating layer 141 has a predetermined permittivity, and thus, a capacitor may be formed by the first and second capacitor electrodes CAE1 and CAE2 and the first interlayer insulating layer 141 disposed between the first and second capacitor electrodes CAE1 and CAE2. The second capacitor electrode CAE2 may be formed as a single layer or multiple layers, and may include at least one of molybdenum (Mo), aluminum (Al), chromium (Cr), gold (Au), titanium (Ti), nickel (Ni), neodymium (Nd), and copper (Cu), or an alloy thereof.

The second interlayer insulating layer 142 may be disposed on the second capacitor electrode CAE2. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may include a plurality of inorganic layers, and may be thicker than the first interlayer insulating layer 141 in the third direction (Z-axis direction).

The first anode connection electrode ANDE1 may be disposed on the second interlayer insulating layer 142. The first anode connection electrode ANDE1 may be connected to the drain electrode D via the first anode contact hole ANCT1, which penetrates the first and second interlayer insulating layers 141 and 142 to expose the drain electrode D of the thin film transistor TFT. The first anode connection electrode ANDE1 may be formed as a single layer or multiple layers, and may include at least one of molybdenum (Mo), aluminum (Al), chromium (Cr), gold (Au), titanium (Ti), nickel (Ni), neodymium (Nd), and copper (Cu), or an alloy thereof.

The first organic layer 160 for planarization may be disposed on the first anode connection electrode ANDE1. The first organic layer 160 may be formed of an organic layer, such as acryl resin, epoxy resin, phenolic resin, polyamide resin, polyimide resin, and the like.

The second anode connection electrode ANDE2 may be disposed on the first organic layer 160. The second anode connection electrode ANDE2 may be connected to the first anode connection electrode ANDE1 via the second anode contact hole ANCT2, which penetrates the first organic layer 160 to expose the first anode connection electrode ANDE1. The second anode connection electrode ANDE2 may be formed as a single layer or multiple layers, and may include at least one of molybdenum (Mo), aluminum (Al), chromium (Cr), gold (Au), titanium (Ti), nickel (Ni), neodymium (Nd), and copper (Cu), or an alloy thereof.

The second organic layer 161 may be disposed on the second anode connection electrode ANDE2. The second organic layer 161 may be formed of an organic layer, such as acryl resin, epoxy resin, phenolic resin, polyamide resin, polyimide resin, and the like.

Although FIG. 10 exemplarily illustrates that the thin film transistor TFT has a top gate structure, in which the gate electrode is located above the active layer, the inventive concepts are not limited thereto. In some exemplary embodiments, the thin film transistor TFT may be formed as a bottom gate structure in which the gate electrode is located below the active layer, or a double gate method in which the gate electrode is located both above and below the active layer.

The light emitting element layer EML may be disposed on the second organic layer 161. The light emitting element layer EML may include light emitting elements LEL and a bank 180. Each of the light emitting elements LEL includes a pixel electrode 171, a light emitting layer 172, and a common electrode 173. The common electrode 173 may be connected in common to the plurality of light emitting elements LEL.

The pixel electrode 171 may be formed on the second organic layer 161. The pixel electrode 171 may be connected to the second anode connection electrode ANDE2 via the third anode contact hole ANCT3, which penetrates the second organic layer 161 to expose the second anode connection electrode ANDE2.

In a top emission structure in which light is emitted toward the common electrode 173 when viewed with respect to the light emitting layer 172, the pixel electrode 171 may be formed of a metal material having high reflectivity to have a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd), and copper (Cu).

The bank 180 may be formed to delimit the pixel electrode 171 on the second organic layer 161 to define the emission area EA. The bank 180 may be formed to cover the edge of the pixel electrode 171. The bank 180 may be formed of an organic layer, such as acryl resin, epoxy resin, phenolic resin, polyamide resin, polyimide resin, and the like.

The emission area EA is an area in which the pixel electrode 171, the light emitting layer 172, and the common electrode 173 are sequentially stacked, such that the holes from the pixel electrode 171 and the electrons from the common electrode 173 are combined with each other to emit light.

The light emitting layer 172 is formed on the pixel electrode 171 and the bank 180. The light emitting layer 172 may include an organic material to emit light having a predetermined color. For example, the light emitting layer 172 includes a hole transporting layer, an organic material layer, and an electron transporting layer.

The common electrode 173 is formed on the light emitting layer 172. The common electrode 173 may be formed to cover the light emitting layer 172. The common electrode 173 may be a common layer formed in common on each of the emission areas EA. In some exemplary embodiments, a capping layer may be formed on the common electrode 173.

In the top emission structure, the common electrode 173 may be formed of transparent conductive oxide (TCO) such as indium tin oxide (ITO) and indium zinc oxide (IZO) capable of transmitting light, or a semi-transmissive conductive material such as magnesium (Mg), silver (Ag), or an alloy of magnesium (Mg) and silver (Ag). When the common electrode 173 is formed of a semi-transmissive conductive material, the light emission efficiency can be increased due to a micro-cavity effect.

The thin film encapsulation layer TFEL may be disposed on the common electrode 173. The thin film encapsulation layer TFEL includes at least one inorganic layer to prevent oxygen or moisture from permeating into the light emitting element layer EML. In addition, the thin film encapsulation layer TFEL includes at least one organic layer to protect the light emitting element layer EML from foreign substances such as dust. For example, the thin film encapsulation layer TFEL may include a first inorganic layer TFE1, an organic layer TFE2, and a second inorganic layer TFE3.

The first inorganic layer TFE1 may be disposed on the common electrode 173, the organic layer TFE2 may be disposed on the first inorganic layer TFE1, and the second inorganic layer TFE3 may be disposed on the organic layer TFE2. The first inorganic layer TFE1 and the second inorganic layer TFE3 may be formed of multiple layers, in which one or more inorganic layers of a silicon nitride layer, a silicon oxynitride layer, a silicon oxide layer, a titanium oxide layer, and an aluminum oxide layer are alternately stacked. The organic layer TFE2 may be formed of acryl resin, epoxy resin, phenolic resin, polyamide resin, polyimide resin, or the like.

The sensor electrode layer SENL may be disposed on the thin film encapsulation layer TFEL. The sensor electrode layer SENL may include the driving electrodes TE, the sensing electrodes RE, and the connection electrode BE1.

A first sensor insulating layer TINS1 may be disposed on the second inorganic layer TFE3. The first sensor insulating layer TINS1 may be formed of multiple layers in which one or more inorganic layers of a silicon nitride layer, a silicon oxynitride layer, a silicon oxide layer, a titanium oxide layer, and an aluminum oxide layer are alternately stacked.

The connection electrode BE1 may be disposed on the first sensor insulating layer TINS1. The connection electrode BE1 may not overlap the first emission area EA1, the second emission area EA2, the third emission area EA3, and the fourth emission area EA4 in the third direction (Z-axis direction). The connection electrode BE1 may overlap the bank 180 in the third direction (Z-axis direction). The connection electrode BE1 may be formed of a single layer including molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

A second sensor insulating layer TINS2 may be disposed on the connection electrode BE1. The second sensor insulating layer TINS2 may be formed of multiple layers, in which one or more inorganic layers of a silicon nitride layer, a silicon oxynitride layer, a silicon oxide layer, a titanium oxide layer, and an aluminum oxide layer are alternately stacked.

The driving electrodes TE and the sensing electrodes RE may be disposed on the second sensor insulating layer TINS2. The driving electrodes TE and the sensing electrode RE may not overlap the first emission area EA1, the second emission area EA2, the third emission area EA3, and the fourth emission area EA4 in the third direction (Z-axis direction). The driving electrodes TE and the sensing electrodes RE may overlap the bank 180 in the third direction (Z-axis direction). The driving electrodes TE may be connected to the first connection electrode BE1 via the first sensor contact hole TCNT1 penetrating the second sensor insulating layer TINS2. The driving electrodes TE and the sensing electrodes RE may be formed of a single layer including molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

A third sensor insulating layer TINS3 may be disposed on the driving electrodes TE and the sensing electrodes RE. The third sensor insulating layer TINS3 may be formed of multiple layers, in which one or more inorganic layers of a silicon nitride layer, a silicon oxynitride layer, a silicon oxide layer, a titanium oxide layer, and an aluminum oxide layer are alternately stacked.

Figure 11:
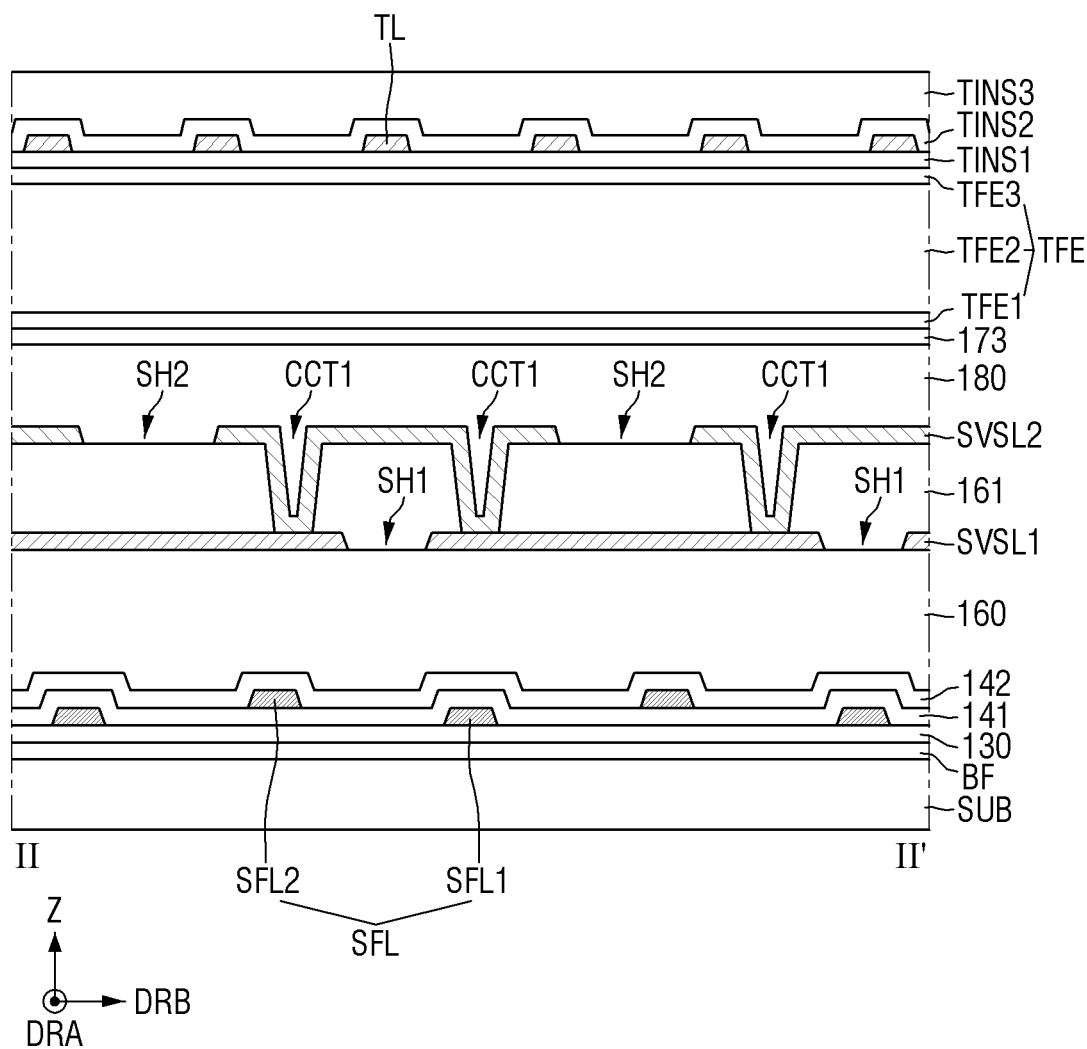
FIG. 11 is a cross-sectional view taken along line II-II' of a display panel of FIG. 8 according to an exemplary embodiment.
Figure 12:
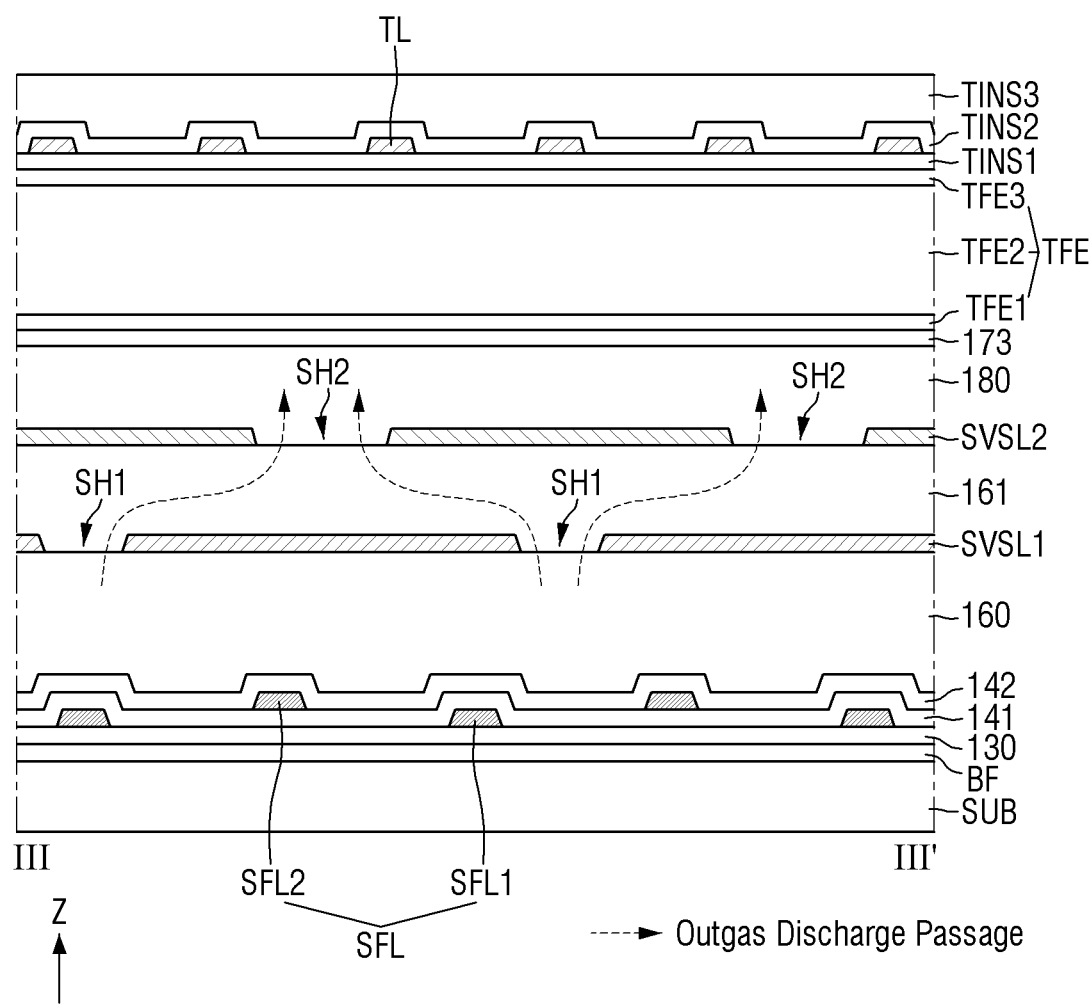
FIG. 12 is a cross-sectional view taken along line III-III' of a display panel of FIG. 8 according to an exemplary embodiment.
Figure 13:
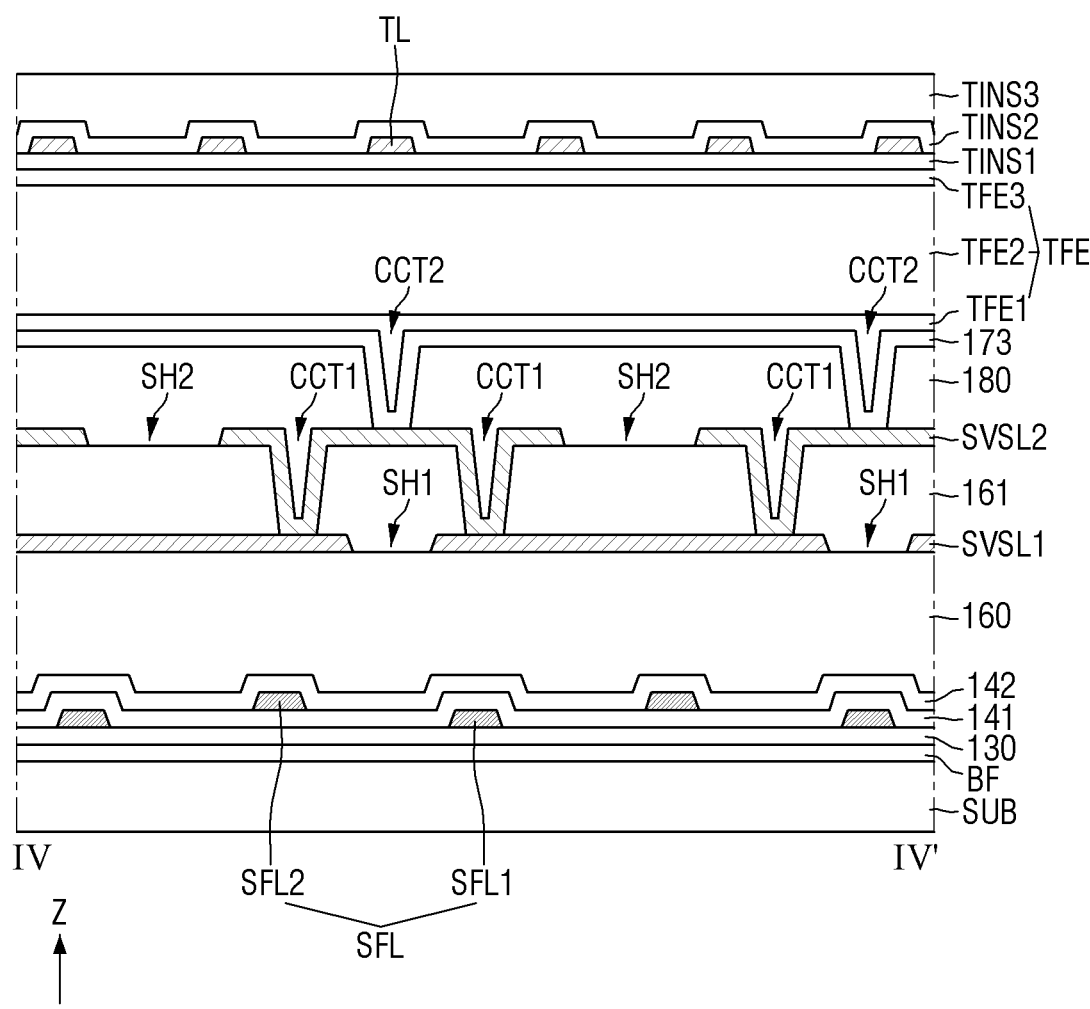
FIG. 13 is a cross-sectional view taken along line IV-IV' of a display panel of FIG. 9 according to an exemplary embodiment.
Figure 14:
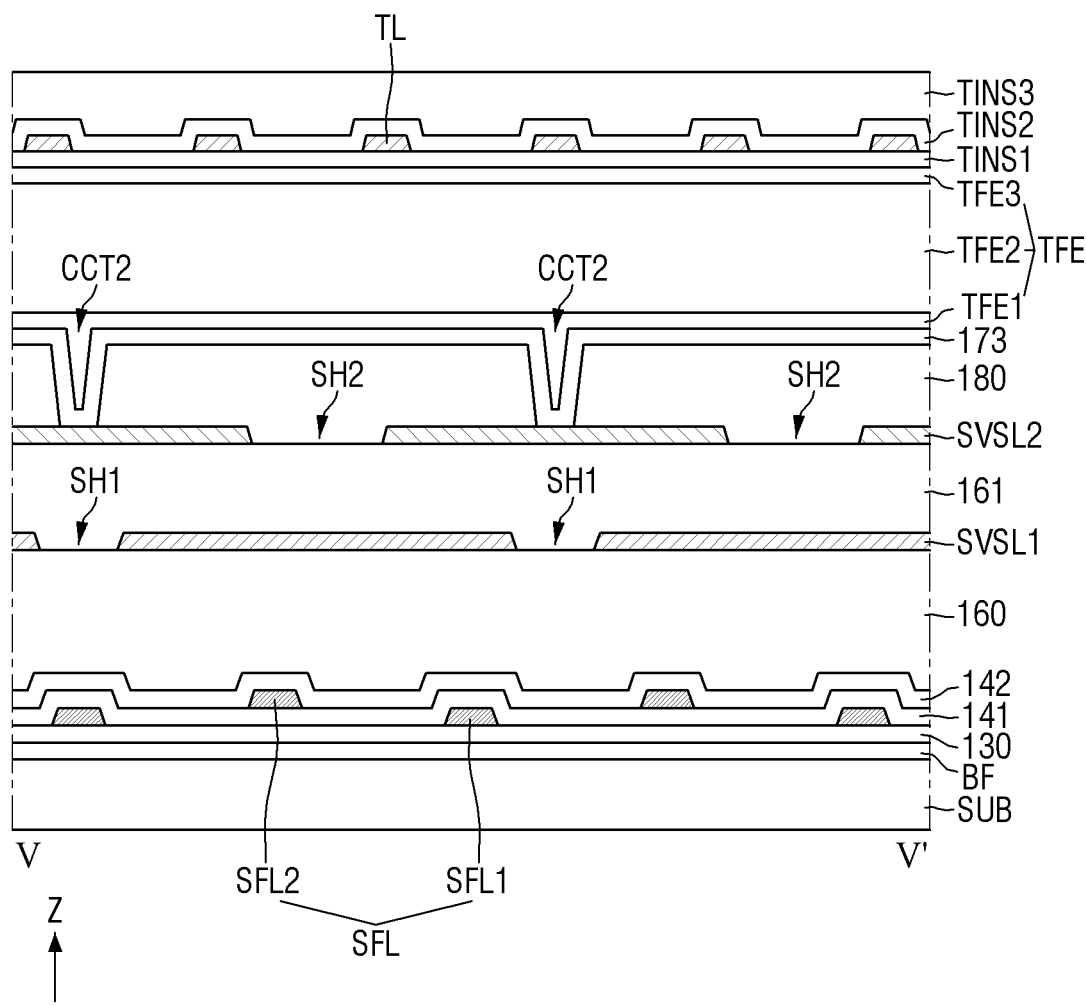
FIG. 14 is a cross-sectional view taken along line V-V' of a display panel of FIG. 9 according to an exemplary embodiment.

FIG. 11 is a cross-sectional view taken along line of a display panel of FIG. 8 according to an exemplary embodiment. FIG. 12 is a cross-sectional view taken along line of a display panel of FIG. 8 according to an exemplary embodiment. FIG. 13 is a cross-sectional view taken along line IV-IV' of a display panel of FIG. 9 according to an exemplary embodiment. FIG. 14 is a cross-sectional view taken along line V-V' of a display panel of FIG. 9 according to an exemplary embodiment.

Referring to FIGS. 11 to 14, the scan fan-out lines SFL may be arranged in the first and second non-display areas NDA1 and NDA2. The scan fan-out lines SFL may include first scan fan-out lines SFL1 disposed on the gate insulating layer 130 and second scan fan-out lines SFL2 disposed on the first interlayer insulating layer 141. The first scan fan-out lines SFL1 may be disposed on the same layer as the gate electrode G of the thin film transistor TFT and the first capacitor electrode CAE1, and may be made of substantially the same material as the gate electrode G of the thin film transistor TFT and the first capacitor electrode CAE1. The second scan fan-out lines SFL2 may be disposed on the same layer as the second capacitor electrode CAE2, and may be made of substantially the same material as the second capacitor electrode CAE2.

The data fan-out lines DFL may be arranged in the first and second non-display areas NDA1 and NDA2. The data fan-out lines DFL may include first data fan-out lines disposed on the gate insulating layer 130 and second data fan-out lines disposed on the first interlayer insulating layer 141. The first data fan-out lines may be disposed on the same layer as the gate electrode G of the thin film transistor TFT and the first capacitor electrode CAE1, and may be made of substantially the same material as the gate electrode G of the thin film transistor TFT and the first capacitor electrode CAE1. The second data fan-out lines may be disposed on the same layer as the second capacitor electrode CAE2, and may be made of substantially the same material as the second capacitor electrode CAE2.

The first sub-driving voltage line SVSL1 may be disposed on the first organic layer 160. The first sub-driving voltage line SVSL1 may be disposed on the same layer as the second anode connection electrode ANDE2, and may be made of substantially the same material as the second anode connection electrode ANDE2.

The second sub-driving voltage line SVSL2 may be disposed on the second organic layer 161. The second sub-driving voltage line SVSL2 may be disposed on the same layer as the pixel electrode 171, and may be made of substantially the same material as the pixel electrode 171.

The second sub-driving voltage line SVSL2 may be connected to the first sub-driving voltage line SVSL1 via the first connection holes CCT1 penetrating the second organic layer 161. The common electrode 173 may be connected to the second sub-driving voltage line SVSL2 via the second connection holes CCT2 penetrating the bank 180.

The driving lines TL may be disposed on the first sensor insulating layer TINS1. The driving lines TL may be disposed on the same layer as the connection electrodes BE1, and may be made of substantially the same material as the connection electrodes BE1. The driving lines TL may be connected to the driving electrodes TE arranged in the display area DA.

When the first holes SH1 of the first sub-driving voltage line SVSL1 and the second holes SH2 of the second sub-driving voltage line SCSL2 overlap each other in the third direction (Z-axis direction), the first scan fan-out line SFL1 or the second scan fan-out line SFL2 may overlap the driving line TL. This may cause a parasitic capacitance between the first scan fan-out line SFL1 or the second scan fan-out line SFL2 and the driving line TL. The parasitic capacitance may cause the scan timing signal of the first scan fan-out line SFL1 or the second scan fan-out line SFL2 and the touch driving signal of the driving line TL affect each other. In order to prevent the parasitic capacitance from affecting the scan timing signal of the first scan fan-out line SFL1 or the second scan fan-out line SFL2 and the touch driving signal of the driving line TL, the first and second holes SH1 and SH2 may be arranged so as not to overlap each other in the third direction (Z-axis direction).

As shown in FIG. 12, an outgas generated by the moisture remaining on the first organic layer 160 may be discharged through the first holes SH1 of the first sub-driving voltage line SVSL1 and the second holes SH2 of the second sub-driving voltage line SVSL2. When the first and second holes SH1 and SH2 do not overlap in the third direction (Z-axis direction), the passage through which outgas is discharged may be increased and delay the discharge of the outgas. In this case, the outgas lingering inside may damage the light emitting layer 172 of the light emitting element LEL, and the sub-pixel including the damaged light emitting layer 172 may not emit light.

Figure 15:
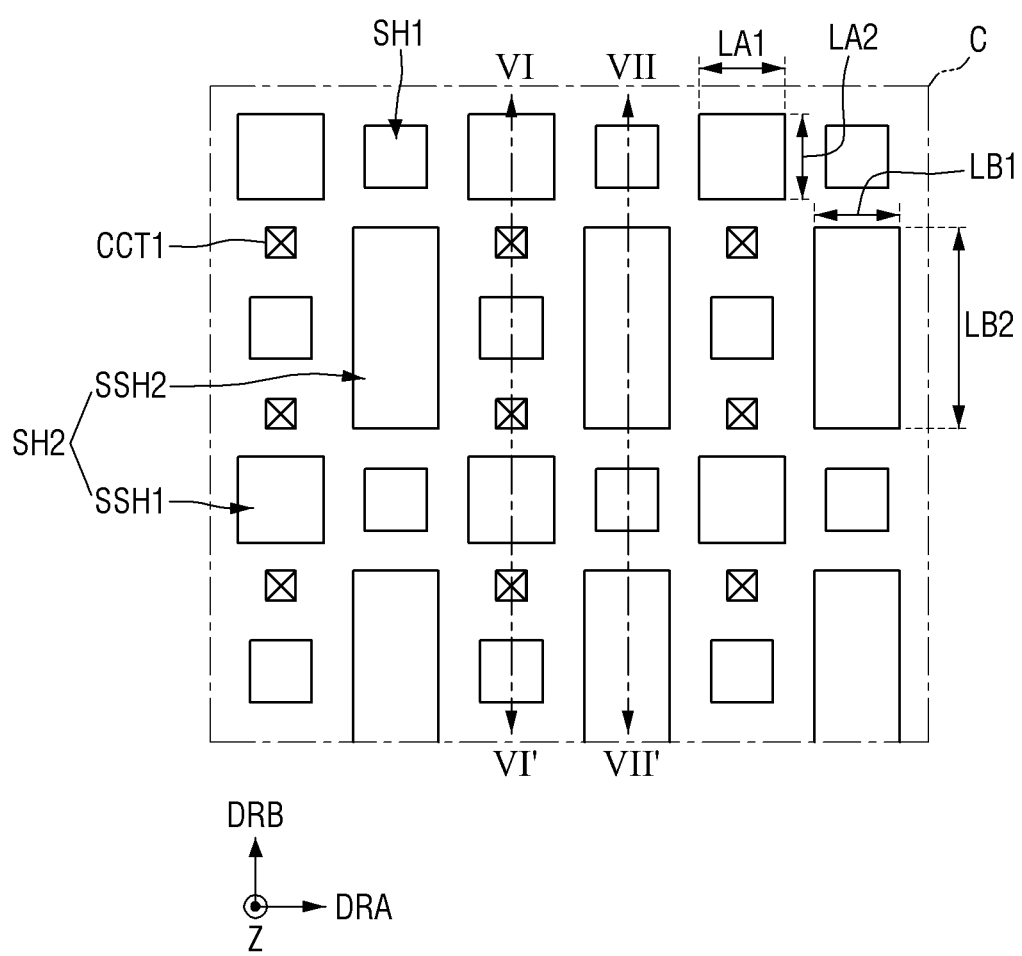
FIG. 15 is a layout view of the first non-display area of FIG. 6 according to another exemplary embodiment.
Figure 16:
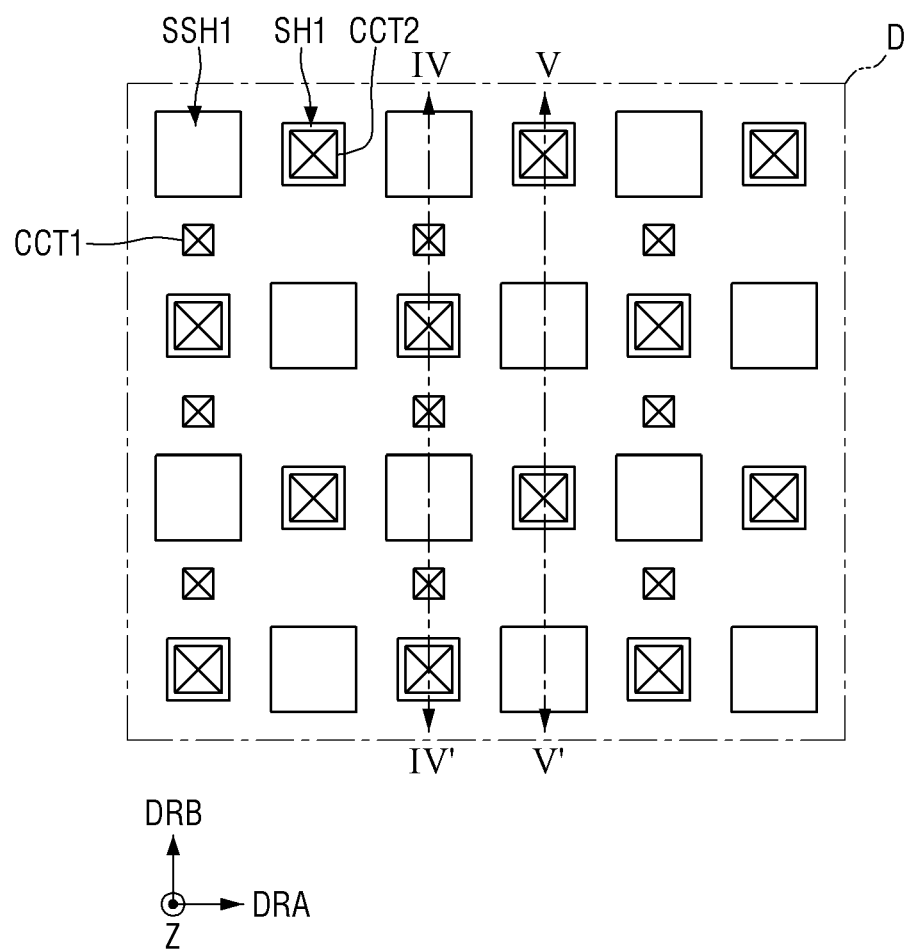
FIG. 16 is a layout view of the second non-display area of FIG. 6 according to another exemplary embodiment.
Figure 17:
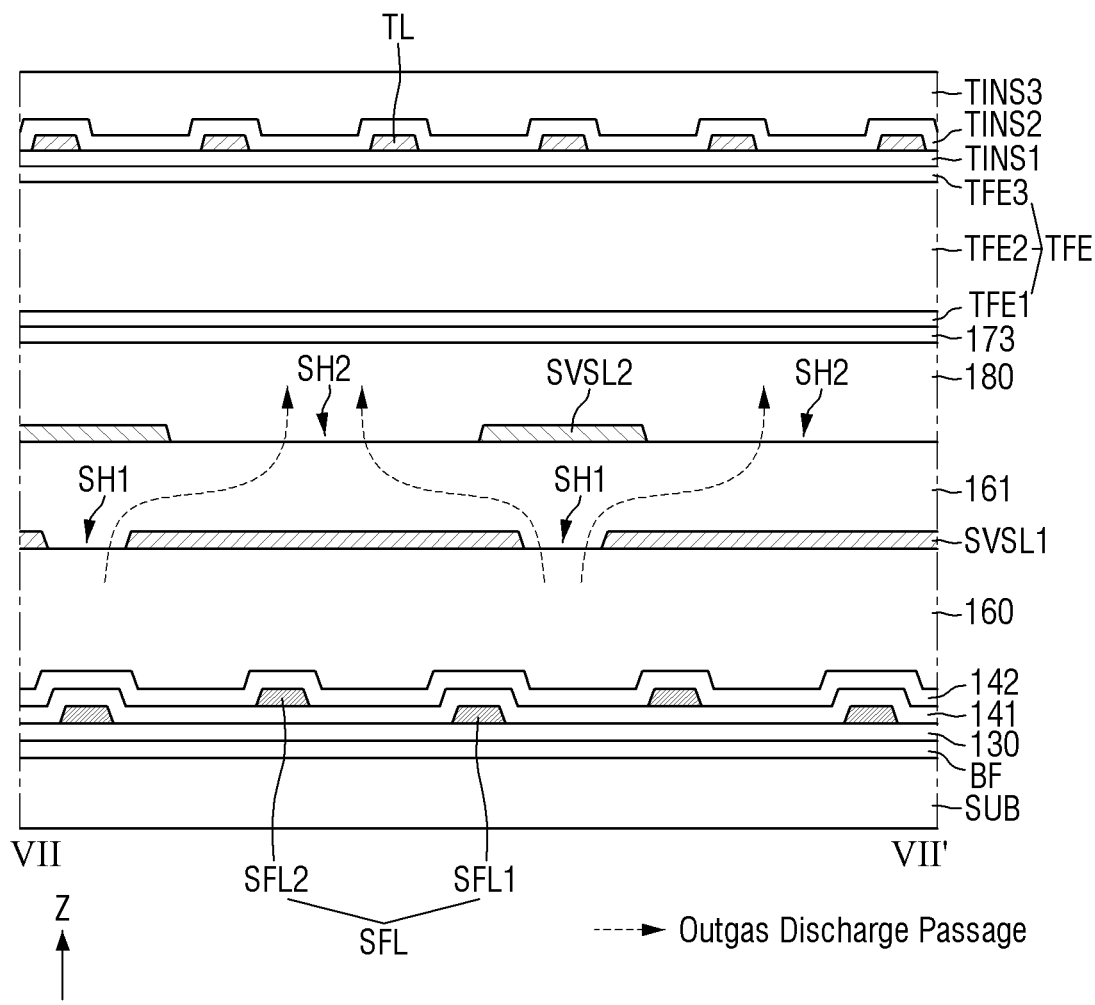
FIG. 17 is a cross-sectional view taken along line VII-VII' of a display panel of FIG. 15 according to an exemplary embodiment.

FIG. 15 is a layout view of the first non-display area of FIG. 6 in detail according to another exemplary embodiment. FIG. 16 is a layout view of the second non-display area of FIG. 6 in detail according to another exemplary embodiment. FIG. 17 is a cross-sectional view taken along line VII-VII' of a display panel of FIG. 15 according to an exemplary embodiment.

The display panel of FIGS. 15 to 17 is substantially the same as that shown in FIGS. 9 to 11, but the second holes SH2 according to the illustrated exemplary embodiment include first sub-holes SSH1 and second sub-holes SSH2 that differ in size. As such, repeated descriptions of the elements forming the display panel already described above will be omitted or simplified, and the differences will be mainly described below. The cross-sectional view taken along line VI-VI' of the display panel of FIG. 15 is substantially identical with FIG. 12, and thus repeated detailed descriptions thereof will also be omitted.

Referring to FIGS. 15 to 17, the second holes SH2 may include the first sub-holes SSH1 and the second sub-holes SSH2. The first sub-holes SSH1 may be arranged in the first and second non-display areas NDA1 and NDA2, and the second sub-holes SSH2 may be arranged in the first non-display area NDA1.

Each of the first sub-holes SSH1 may be smaller in size than each of the second sub-holes SSH2. A length LA1 of each of the first sub-holes SSH1 in the one direction DRA may be substantially equal to a length LA2 of each of the second sub-holes SSH2 in the one direction DRA. A length LB1 of each of the first sub-holes SSH1 in the other direction DRB may be less than a length LB2 of each of the second sub-holes SSH2 in the other direction DRB.

The first holes SH1 and the first sub-holes SSH1 may be arranged in odd-numbered rows, and the first holes SH1 and the second sub-holes SSH2 may be arranged in even-numbered rows.

The first holes SH1 and the first sub-holes SSH1 may be alternately arranged in the one direction DRA. For example, the first holes SH1 and the first sub-holes SSH1 may be arranged in the order of the first sub-hole SSH1, the first hole SH1, the first sub-hole SSH1, and the first hole SH1 in the one direction DRA.

The first holes SH1 and the second sub-holes SSH2 may be alternately arranged in the one direction DRA. For example, the first holes SH1 and the second sub-holes SSH2 may be arranged in the order of the first hole SH1, the second sub-hole SSH2, the first hole SH1, and the second sub-hole SSH2 in the one direction DRA.

The first holes SH1 and the first sub-holes SSH1 may be arranged in odd-numbered columns, and the first holes SH1 and the second sub-holes SSH2 may be arranged in even-numbered columns.

The first holes SH1 and the first sub-holes SSH1 may be alternately arranged in the other direction DRB. For example, the first holes SH1 and the first sub-holes SSH1 may be arranged in the order of the first sub-hole SSH1, the first hole SH1, the first sub-hole SSH1, and the first hole SH1 in the other direction DRB.

The first holes SH1 and the second sub-holes SSH2 may be alternately arranged in the other direction DRB. For example, the first holes SH1 and the second sub-holes SSH2 may be arranged in the order of the first hole SH1, the second sub-hole SSH2, the first hole SH1, and the second sub-hole SSH2 in the other direction DRB.

The first holes SH1, the first sub-holes SSH1, the second sub-holes SSH2, and the first connection holes CCT1 may not overlap one another in the third direction (Z-axis direction). The first connection hole CCT1 may be arranged between the first hole SH1 and the first sub-hole SSH1 the other direction DRB in the odd-numbered columns. The first connection hole CCT1 may be arranged between the second sub-holes SSH2 adjacent in the one direction DRA.

As shown in FIG. 17, the outgas generated by the moisture remaining on the first organic layer 160 may be discharged through the first holes SH1 of the first sub-driving voltage line SVSL1 and the second sub-holes SSH2 of the second sub-driving voltage line SVSL2. When the first connection hole CCT1 is not disposed between the first hole SH1 and the second sub-hole SSH2, the length of the second sub-hole SSH2 in the other direction DRB may be increased to be longer than the length of the second sub-hole SSH2 in the one direction DRA. In this manner, the size of the second sub-hole SSH2 can be increased to be larger than the size of the first sub-hole SSH1. As such, the discharge passage via the second sub-holes SSH2 may be increased to facilitate discharge of the outgas. Accordingly, damage to the light emitting layer 172 of the light emitting element LEL, which may occur when the outgas has not been discharged, may be prevented or at least be suppressed.

The display panel of FIG. 16 differs from that of FIG. 9 in that the second holes SH2 are replaced by the first sub-holes SSH1 in the second non-display area NDA2. As such, repeated descriptions of the second non-display area NDA2 with reference to FIG. 16 will be omitted.

Figure 18:
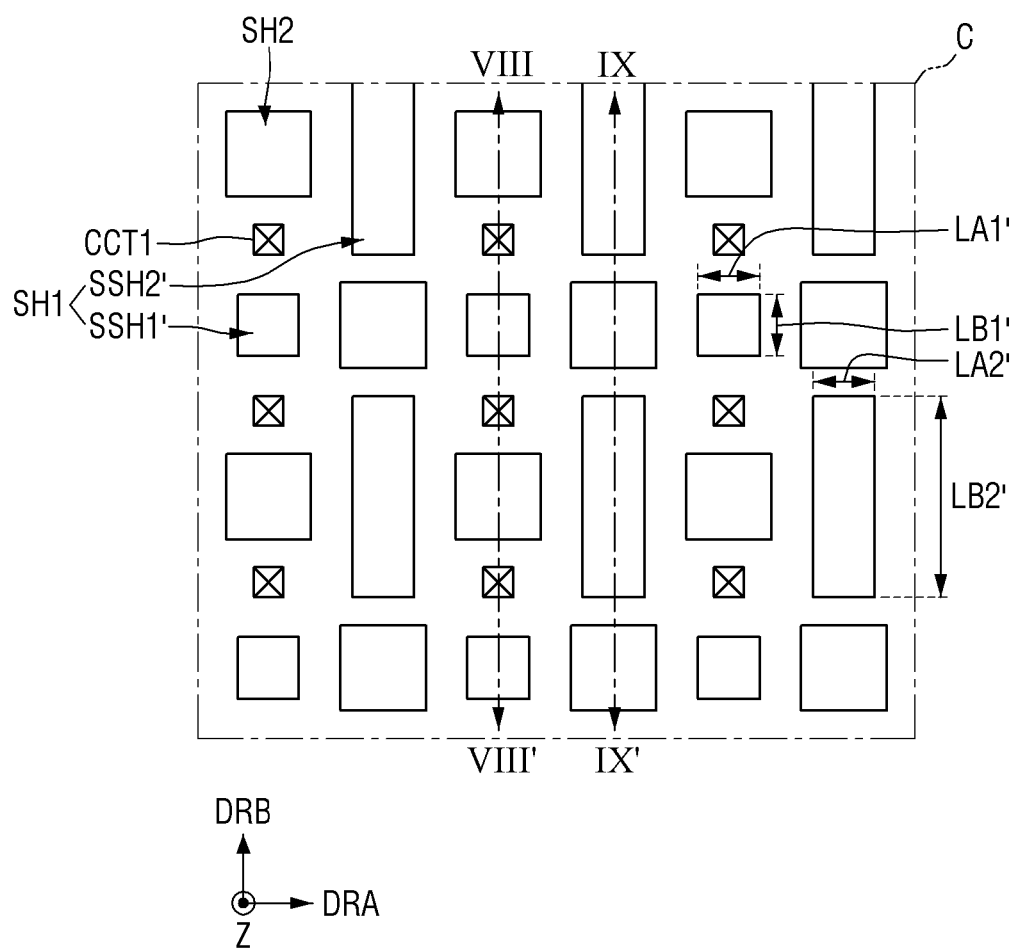
FIG. 18 is a layout view of the first non-display area of FIG. 6 according to still another exemplary embodiment.
Figure 19:
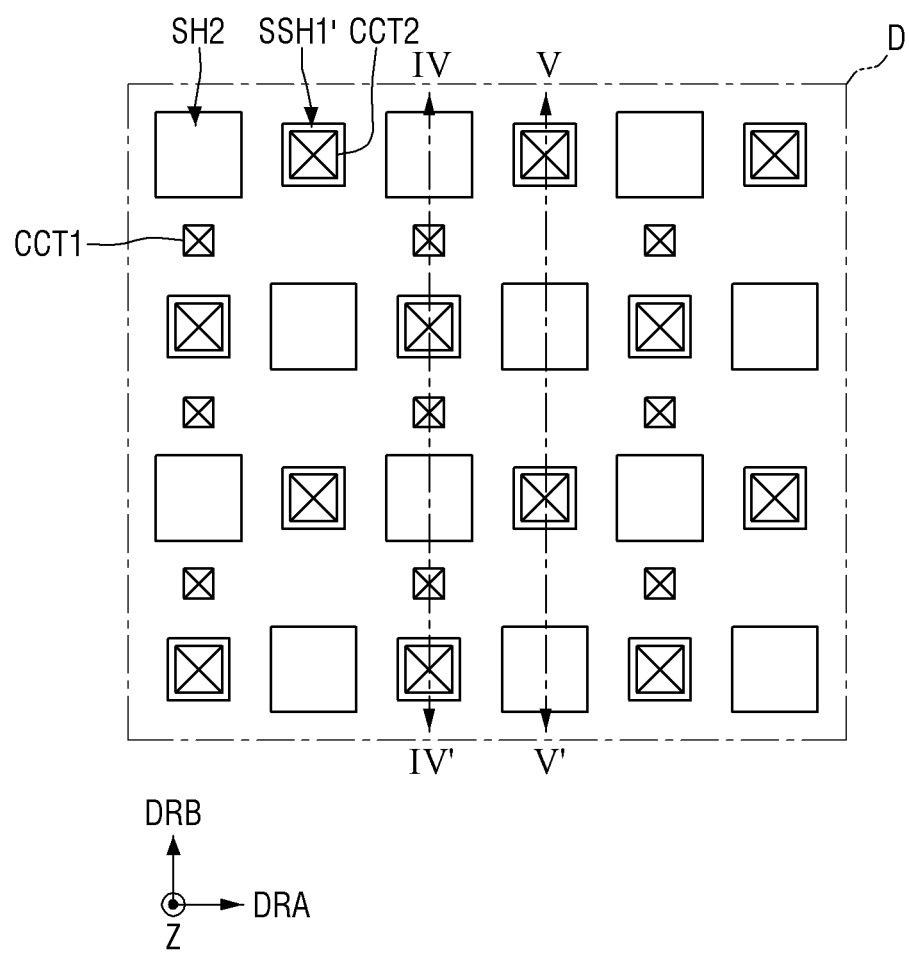
FIG. 19 is a layout view of the second non-display area of FIG. 6 according to still another exemplary embodiment.
Figure 20:
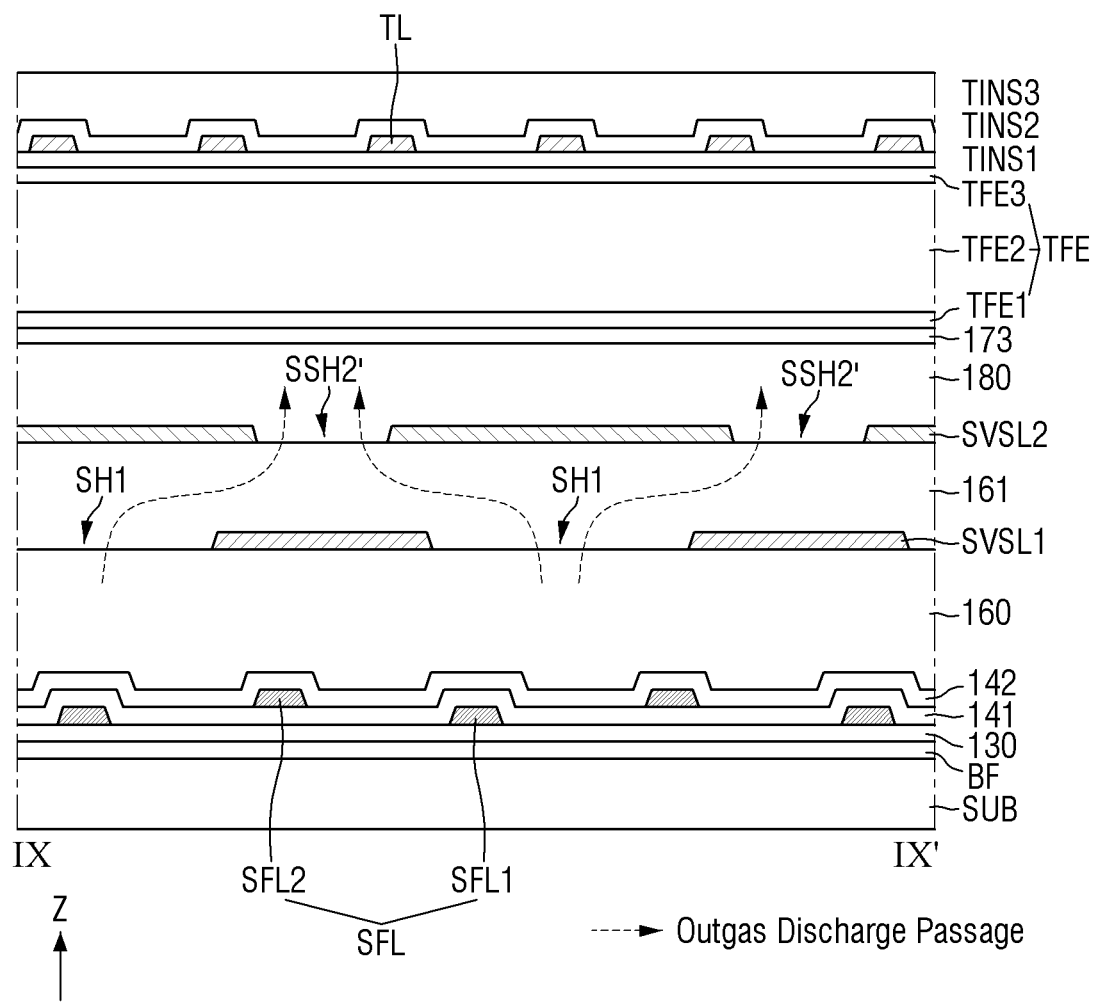
FIG. 20 is a cross-sectional view taken along line IX-IX' of a display panel of FIG. 18 according to an exemplary embodiment.

FIG. 18 is a layout view of the first non-display area of FIG. 6 in detail according to still another exemplary embodiment. FIG. 19 is a layout view of the second non-display area of FIG. 6 in detail according to still another exemplary embodiment. FIG. 20 is a cross-sectional view taken along line IX-IX' of a display panel of FIG. 18 according to an exemplary embodiment.

The display panel of FIGS. 18 to 20 is substantially similar to that shown in FIGS. 9 to 11, but the first holes SH1 according to the illustrated exemplary embodiment include first sub-holes SSH1' and second sub-holes SSH2' that differ in size. As such, repeated descriptions of the elements forming the display panel already described above will be omitted or simplified, and the differences will be mainly described. The cross-sectional view taken along line VIII-VIII' of the display panel of FIG. 18 is substantially identical with FIG. 14, and thus repeated descriptions thereof will be omitted.

Referring to FIGS. 18 to 20, the first holes SH1 may include the first sub-holes SSH1' and the second sub-holes SSH2'. The first sub-holes SSH1' may be arranged in the first and second non-display areas NDA1 and NDA2, and the second sub-holes SSH2' may be arranged in the first non-display area NDA1.

Each of the first sub-holes SSH1' may be smaller in size than each of the second sub-holes SSH2'. A length LA1' of each of the first sub-holes SSH1' in the one direction DRA may be substantially equal to a length LA2' of each of the second sub-holes SSH2' in the one direction DRA. A length LB1' of each of the first sub-holes SSH1' in the other direction DRB may be less than a length LB2' of each of the second sub-holes SSH2' in the other direction DRB.

The second holes SH2 and the first sub-holes SSH1' may be arranged in even-numbered rows, and the second holes SH2 and the second sub-holes SSH2' may be arranged in odd-numbered rows.

The second holes SH2 and the first sub-holes SSH1' may be alternately arranged in the one direction DRA. For example, the second holes SH2 and the first sub-holes SSH1' may be arranged in the order of the first sub-hole SSH1', the second hole SH2, the first sub-hole SSH1', and the second hole SH2 in the one direction DRA.

The second holes SH2 and the second sub-holes SSH2' may be alternately arranged in the one direction DRA. For example, the second holes SH2 and the second sub-holes SSH2' may be arranged in the order of the second hole SH2, the second sub-hole SSH2', the second hole SH2, and the second sub-hole SSH2' in the one direction DRA.

The second holes SH2 and the first sub-holes SSH1' may be arranged in odd-numbered columns, and the second holes SH2 and the second sub-holes SSH2' may be arranged in even-numbered columns.

The second holes SH2 and the first sub-holes SSH1' may be alternately arranged in the other direction DRB. For example, the second holes SH2 and the first sub-holes SSH1' may be arranged in the order of the second hole SH2, the first sub-hole SSH1', the second hole SH2, and the first sub-hole SSH1' in the other direction DRB.

The second holes SH2 and the second sub-holes SSH2' may be alternately arranged in the other direction DRB. For example, the second holes SH2 and the second sub-holes SSH2' may be arranged in the order of the second sub-hole SSH2', the second hole SH2, the second sub-hole SSH2', and the second hole SH2 in the other direction DRB.

The second holes SH2, the first sub-holes SSH1', the second sub-holes SSH2', and the first connection holes CCT1 may not overlap one another in the third direction (Z-axis direction). The first connection hole CCT1 may be disposed between the second hole SH2 and the first sub-hole SSH1' in the other direction DRB in the odd-numbered columns. The first connection hole CCT1 may be disposed between the adjacent second sub-holes SSH2' in the one direction DRA.

As shown in FIG. 20, the outgas generated by the moisture remaining on the first organic layer 160 may be discharged through the second sub-holes SSH2' of the first sub-driving voltage line SVSL1 and the second holes SH2 of the second sub-driving voltage line SVSL2. When the first connection hole CCT1 is not disposed between the second sub-hole SSH2' and second hole SH2, the length of the second sub-hole SSH2' in the other direction DRB to be formed longer than the length of the second sub-hole SSH2' in the one direction DRA. In this manner, the size of the second sub-hole SSH2' can be increased to be larger than the size of the first sub-hole SSH1'. As such, the passage for discharging the outgas via the second sub-holes SSH2' may be increased to facilitate discharge of the outgas. Accordingly, damage to the light emitting layer 172 of the light emitting element LEL, which may occur when the outgas has not been discharged, may be prevented or at least be suppressed.

Meanwhile, the display panel of FIG. 19 differs from that of FIG. 9 in that the first holes SH1 are replaced by the first sub-holes SSH1' in the second non-display area NDA2. Thus, repeated descriptions of the second non-display area NDA2 with reference to FIG. 19 will be omitted.

In a display device constructed according to the principles and some exemplary embodiments of the invention, an outgas generated by moisture remaining on an organic layer can be discharged through first holes of a first sub-driving voltage line and second holes of a second sub-driving voltage line. When a first connection hole for connection of the first and second sub-driving voltage lines is not disposed between the first and second holes in one direction, it is possible to increase the length of the first hole or the second hole in the one direction to be longer than the length of the first hole or the second hole in the other direction. In this manner, the size of the first hole or the second hole may be increased to increase a discharge passage via the first holes or the second holes, thereby facilitating discharge of the outgas. Therefore, it is possible to reduce damage to the light emitting layer of the light emitting element, which may otherwise occur when the outgas has not been discharged.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display area configured to display an image;
a first non-display area disposed adjacent to the display area;
a second non-display area disposed adjacent to the first non-display area; and
a first driving voltage line disposed in the first non-display area and the second non-display area, the first driving voltage line being configured to be applied with a first driving voltage and includes:
a first sub-driving voltage line including first holes which penetrate the first sub-driving voltage line; and
a second sub-driving voltage line disposed on the first sub-driving voltage line and including second holes which penetrate the second sub-driving voltage line,
wherein the second holes include first sub-holes and second sub-holes having a different size than the first sub-holes.

2. The display device of claim 1, wherein:
the first sub-holes are disposed in the first non-display area and the second non-display area; and
the second sub-holes are disposed in the first non-display area.

3. The display device of claim 1, wherein a length of the second sub-hole in a first direction is greater than a length of the first sub-hole in the first direction.

4. The display device of claim 1, wherein the first holes, the first sub-holes, and the second sub-holes do not overlap each other.

5. The display device of claim 1, wherein:
the second sub-driving voltage line is connected to the first sub-driving voltage line through first connection holes in the first non-display area and the second non-display area; and
the first connection holes do not overlap the first holes and the second holes.

6. The display device of claim 5, wherein in the first non-display area, one of the first connection holes is disposed between one of the first holes and the first sub-hole in a first direction.

7. The display device of claim 6, wherein in the first non-display area, one of the first connection holes and the first hole are disposed between adjacent second sub-holes in a second direction crossing the first direction.

8. The display device of claim 5, wherein in the second non-display area, the first holes and the first sub-holes are alternately arranged in a first direction.

9. The display device of claim 8, wherein in the second non-display area, the first holes and the first sub-holes are alternately arranged in a second direction crossing the first direction.

10. The display device of claim 8, wherein in the second non-display area, one of the first connection holes is disposed between the first hole and the first sub-hole in the first direction.

11. The display device of claim 5, further comprising:
a pixel electrode and a light emitting layer disposed in the display area; and
a common electrode disposed on the light emitting layer, and connected to the second sub-driving voltage line through second connection holes in the second non-display area.

12. The display device of claim 11, wherein one of the second connection holes overlaps one of the first holes.

13. A display device comprising:
a display area configured to display an image;
a first non-display area disposed adjacent to the display area;
a second non-display area disposed adjacent to the first non-display area; and
a first sub-driving voltage line disposed in the first non-display area and the second non-display area, the first sub-driving voltage line being configured to be applied with a first driving voltage and includes first holes which penetrate the first sub-driving voltage line,
wherein the first holes include first sub-holes and second sub-holes having a different size than the first sub-holes.

14. The display device of claim 13, wherein:
the first sub-holes are disposed in the first non-display area and the second non-display area; and
the second sub-holes are disposed in the first non-display area.

15. The display device of claim 13, wherein a length of the second sub-hole in a first direction is greater than a length of the first sub-hole in the first direction.

16. The display device of claim 13, further comprising a second sub-driving voltage line disposed on the first sub-driving voltage line and including second holes,
wherein the second holes, the first sub-holes, and the second sub-holes do not overlap each other.

17. The display device of claim 16, wherein:
the second sub-driving voltage line is connected to the first sub-driving voltage line through first connection holes in the first non-display area and the second non-display area; and the first connection holes do not overlap the first holes and the second holes.

18. A display device comprising:
a display area configured to display an image;
a first non-display area disposed adjacent to the display area;
a second non-display area disposed adjacent to the first non-display area; and
a first driving voltage line disposed in the first non-display area and the second non-display area, the first driving voltage line being configured to be applied with a first driving voltage and includes:
   a first sub-driving voltage line including first holes which penetrate the first sub-driving voltage line; and
   a second sub-driving voltage line disposed on the first sub-driving voltage line and including second holes which penetrate the second sub-driving voltage line,
wherein a size of one of the second holes in the first non-display area is different from a size of one of the second holes in the second non-display area.

19. The display device of claim 18, wherein in the first non-display area, a size of one of the first holes is different from a size of the second hole.

20. The display device of claim 18, wherein a length of the second hole in a first direction in the first non-display area is greater than a length of the second hole in the first direction in the second non-display area.

* * * * *